(12) United States Patent
Nagamura et al.

(10) Patent No.: US 6,340,543 B1
(45) Date of Patent: Jan. 22, 2002

(54) PHOTOMASK, MANUFACTURING METHOD THEREOF, AND SEMICONDUCTOR DEVICE

(75) Inventors: Yoshikazu Nagamura, Tokyo; Kazuhito Suzuki, Hyogo; Kunihiro Hosono; Nobuyuki Yoshioka, both of Tokyo, all of (JP)

(73) Assignees: Mitsubishi Denki Kabushiki Kaisha, Tokyo; Ryoden Semiconductor System Engineering Corporation, Itami, both of (JP)

( * ) Notice: Subject to any disclaimer, the term of this patent is extended or adjusted under 35 U.S.C. 154(b) by 0 days.

(21) Appl. No.: 09/557,326

(22) Filed: Apr. 25, 2000

(30) Foreign Application Priority Data

Oct. 19, 1999 (JP) .......................................... 11-296705

(51) Int. Cl.$^7$ .............................. G03F 9/00; G21K 5/10
(52) U.S. Cl. ........................................ 430/5; 250/492.22
(58) Field of Search ........................... 430/5, 322, 394; 382/144; 250/492.22

(56) References Cited

U.S. PATENT DOCUMENTS 6,165,649 A * 12/2000 Grenon et al. ................. 430/5
6,235,434 B1 * 5/2001 Sweeney et al. ............... 430/5

* cited by examiner

Primary Examiner—S. Rosasco
(74) Attorney, Agent, or Firm—Oblon, Spivak, McClelland, Maier & Neustadt, P.C.

(57) ABSTRACT

A corrected irradiation region (14) to be irradiated with a laser light under given output conditions to remove an opaque extension defect (13) is set to include: $\hat{1}$ an irradiation region (14A) containing the opaque extension defect (13) and having widths w1 and w2 and $\hat{2}$ a pattern repaired region (14B) having the width w2 and extending in the negative direction in a first direction D1 by the absolute value of a quantity of bias offset of repairing $\Delta w$ from the connection between the opaque extension defect (13) and the pattern edge (12E). The quantity of correction offset $\Delta w$ is set so that the dimensional variation rate of the resist pattern transferred falls within a range permitted for the device quality. Part of the pattern edge (12E) is missing by the width $|\Delta w|$ after the irradiation of laser light. When the design pattern dimension as dimensional value on the photomask is reduced to about 1 $\mu$m, for example, it is thus possible to alleviate the adverse effect of the dimensional variation of the resist pattern on the device quality that is caused by a reduction in transmittance in the repaired defect portion.

16 Claims, 23 Drawing Sheets

RESULTS OF TRANSFER, WITH 1.0 μm L/S AND 1.0 μm DEFECT SIZES w1, w2 IN GAS-ASSISTED ETCHING REPAIR

PHOTOMASK, MANUFACTURING METHOD THEREOF, AND SEMICONDUCTOR DEVICE

BACKGROUND OF THE INVENTION

1. Field of the Invention

The present invention relates to a method for repairing opaque defects (remaining defects) in metal film patterns on a photomask used as an original form in a photomechanical process during manufacture of semiconductor devices (LSIs), and to the structure of the metal film patterns repaired on the photomask.

2. Description of the Background Art

A photomask is used as an original form when transferring resist patterns onto wafer surfaces with a transfer apparatus in a photomechanical process during manufacture of semiconductor devices, on which patterns corresponding to the resist patterns are formed with metal film of CrON etc. If the metal film pattern has residue of the metal film (opaque defects) or blanks of the metal film (clear defects or pinhole defects) differing from the originally designed pattern, then the pattern transferred to the wafer may, depending on the defect size, differ from the originally designed resist pattern or the dimensions of the transferred pattern may vary from those of the original pattern. Furthermore, with the size reduction of the integrated circuit patterns to be finally produced by using the resist as a mask, the dimensional precision required for the resist pattern is becoming more severe, and accordingly the defect size limit allowed on the mask is becoming smaller. When defects exist in the metal film pattern on a photomask, the allowable defect size is usually limited to one-fourth to one-third of the design pattern dimensions (on the mask) so that the defects are not transferred onto the wafer or so that the transferred defects will not cause variation in dimensions from those of the original resist pattern or integrated circuit pattern over a permissible range determined on the basis of the semiconductor product's quality. Accordingly, while the allowable defect size on a mask was about 1 $\mu$m in a semiconductor product with about 3-$\mu$m design pattern dimension, the allowable defect size is reduced to about 0.3 $\mu$m when the integrated circuit pattern is downsized and the design pattern dimension is reduced to about 1 $\mu$m.

A conventional method for repairing opaque defects on the photomask will now be described referring to the plane views of FIGS. 28 and 29. As shown in FIG. 28, the opaque defects include isolated defects (hereinafter referred to as isolated opaque defects) like that shown by 73 and defects continuous with one of the edges of the original metal film pattern 70 (hereinafter referred to as opaque extension defects) like that shown by 72. A laser repair method using YAG (yttrium/aluminum/garnet) laser etc. is usually used to repair such opaque defects 72 and 73. That is to say, as shown in FIG. 29, a laser light beam is shaped through an aperture (not shown) in accordance with the size and shape of the opaque defects 72 and 73 and applied to the opaque defect portions. Then the opaque defects 72 and 73 absorb energy of the laser light and they thus evaporate and disappear. Particularly, for repair of the isolated opaque defect 73, a laser irradiation region 74 is set to sufficiently include the entire defect and the laser light beam is applied to the inside of the region 74 to completely remove the isolated opaque defect 73. For repair of the opaque extension defect 72, the laser light is applied in the same way as in the case of the repair of the isolated opaque defect 73 so that the opaque extension defect 72 can be completely removed. Particularly, for the opaque extension defect 72, the optical system on the optical path is adjusted so that the boundary along which the opaque extension defect 72 is in contact with one edge of the pattern 70 can reproduce the original edge of the pattern defined in the absence of the opaque extension defect 72, and the laser light is applied with one end of the laser irradiation region 74 aligned with the extension of the original pattern edge. That is to say, the original pattern edge is reproduced without allowing the metal film to remain in the repaired area after the opaque extension defect 72 is repaired with laser, or without causing the edge in the repaired area to be recessed from the position of the original pattern edge by excessively removing the metal film. The above-described repairing method is applied to common photomasks mainly using CrON film and also to phase shift photomasks mainly using CrON film or MoSiON film.

The methods for repairing opaque extension defects also include, as well as the laser repair method, a method using ion beam (ion beam etching method), where the beam can be positioned more accurately than in the laser light repair method. In this repair method, as in the case of the laser repair method, the defects are repaired to reproduce the original pattern edges without allowing the metal film to remain in areas where opaque extension defects have been repaired and without causing the repaired areas to be recessed by excessive repair.

The conventional laser repair method or ion beam etching method raise the following problem in the repair of opaque defects. The problem will now be described referring to the plane views of FIGS. 30 and 31.

That is to say, in the areas 75 in FIG. 30 in which the opaque defects have been repaired (opaque defect repaired portions), a very thin film of light-shielding metal remains or the surface of the quartz glass is roughed by the irradiation of beam. Accordingly, the transmittance in the opaque defect repaired portions 75 is lower than that in the original quartz glass portions 71 (FIG. 28) where no opaque defect exists. Hence, when the metal film pattern is transferred onto a semiconductor wafer after the photomask is repaired to form a resist pattern, the exposure to the resist areas located right under the opaque defect repaired portions differs from (is smaller than) the exposure to the other resist areas located right under the original quartz glass portions free of opaque defect. Then, as shown in FIG. 31, parts of the edges of the resist pattern 76 on the semiconductor wafer swell, which raises the problem of dimensional variation of the pattern 76. Such dimensional variation does not cause serious problem in device quality if the devices have such large design pattern dimensions on photomasks, e.g. about 3 $\mu$m, as would allow large dimensional variation. However, when the design pattern dimension on photomasks is reduced to about 1 $\mu$m, for example, the dimensional variation of the resist pattern due to the transmittance reduction in areas where opaque defects have been repaired by the conventional method seriously affect the device quality over the permissible range. This problem is likely to happen in areas in which isolated opaque defects existing near the metal film pattern have been repaired or in areas where opaque extension defects continuous with edges of the metal film patterns have been repaired. Especially, this problem is very likely to occur in memory cells in DRAM etc. where finest patterns are formed densely.

SUMMARY OF THE INVENTION

A first aspect of the present invention is directed to a method for manufacturing a photomask comprising a quartz glass and a pattern composed of a metal film formed on a surface of the quartz glass. According to the present invention, the method comprises the steps of: detecting whether the pattern has an opaque defect continuous with or proximate to the pattern and having a first width in a first direction and a second width in a second direction, the second direction being perpendicular to the first direction and corresponding to a direction in which an edge of the pattern is extended; and when the opaque defect is detected in the step of detecting, removing the opaque defect by applying a given beam onto a beam irradiation region obtained by correcting in the first direction an irradiation region on the surface of the quartz glass which contains the opaque defect and has third and fourth widths respectively in the first and second directions on the basis of a quantity of bias offset of repairing, wherein the quantity of the bias offset is set in accordance with an output condition of the given beam, the dimension in the first direction of a region on the surface of the quartz glass where the opaque defect exists, and size of the opaque defect so that, when the pattern is transferred onto a semiconductor substrate to form a resist pattern by using the photomask obtained after the step of applying the given beam, the rate of dimensional variation of the resist pattern with respect to original dimension of the resist pattern to be obtained in the absence of the opaque defect falls within a given range, and when the quantity of bias offset of repairing has a minus sign, the given beam is controlled so that the beam irradiation region is given as a region including the irradiation region and a pattern repaired region extending into the pattern in the first direction by the absolute value of the quantity of the bias offset, from a boundary between the opaque defect and the pattern when the opaque defect is continuous with the pattern, and from a part facing to the opaque defect in the edge of the pattern when the opaque defect is proximate to the pattern.

Preferably, according to a second aspect of the invention, in the photomask manufacturing method, the pattern repaired region has, in the second direction, a width larger than the second width.

Preferably, according to a third aspect of the invention, in the photomask manufacturing method, the quantity of bias offset of repairing corresponds to an optimum quantity of the bias offset, and the optimum quantity of the bias offset is a quantity of the bias offset which is set when the rate of dimensional variation is 0%.

Preferably, according to a fourth aspect of the invention, in the photomask manufacturing method, when the quantity of bias offset of repairing has a plus sign, the given beam is controlled so that the beam irradiation region is given as a region obtained by narrowing the irradiation region in the first direction by the absolute value of the quantity of the bias offset.

Preferably, according to a fifth aspect of the invention, in the photomask manufacturing method, the pattern is a linear interconnection pattern.

Preferably, according to a sixth aspect of the invention, in the photomask manufacturing method, the pattern has a rectangular opening and the edge of the pattern corresponds to part of the side of the opening.

Preferably, according to a seventh aspect of the invention, in the photomask manufacturing method, the given beam is a laser light beam.

Preferably, according to an eighth aspect, in the photomask manufacturing method, the given beam is an ion beam.

A ninth aspect of the invention is directed to a semiconductor device comprising: a semiconductor substrate; and an integrated circuit pattern obtained on the basis of a resist pattern obtained by transferring the pattern onto the semiconductor substrate by using a photomask manufactured by the photomask manufacturing method of the first aspect.

A tenth aspect of the invention is directed to a semiconductor device comprising: a semiconductor substrate; and an integrated circuit pattern obtained on the basis of a resist pattern obtained by transferring the pattern onto the semiconductor substrate by using a photomask manufactured by the photomask manufacturing method of the fourth aspect.

An eleventh aspect of the invention is directed to a method for manufacturing a photomask comprising a quartz glass and adjacent first and second patterns composed of a metal film formed on a surface of the quartz glass. According to the invention, the method comprises the steps of: detecting whether the patterns have an opaque defect continuous with the first and second patterns and having a first width in a first direction and a second width in a second direction, the second direction being perpendicular to the first direction and corresponding to a direction in which edges of the patterns are extended; and when the opaque defect is detected in the step of detecting, removing the opaque defect by applying a given beam onto a corrected irradiation region obtained by correcting in the first direction an irradiation region on the surface of the quartz glass which contains the opaque defect and has a third width corresponding to the first width and a fourth width respectively in the first and second directions on the basis of a quantity of bias offset of repairing, wherein the quantity of the bias offset is set in accordance with an output condition of the given beam, the dimension in the first direction of a region on the surface of the quartz glass where the opaque defect exists, and size of the opaque defect so that, when the patterns are transferred onto a semiconductor substrate to form resist patterns by using the photomask obtained after the step of applying the given beam, the rate of dimensional variation of the resist patterns with respect to original dimension of the resist patterns to be obtained in the absence of the opaque defect falls within a given range. The quantity of bias offset of repairing has an absolute value equal to a sum of the absolute value of a first quantity of the bias offset and the absolute value of a second quantity of the bias offset, and the beam irradiation region comprises the irradiation region, a first pattern repaired region extending into the first pattern in the first direction by the absolute value of the first quantity of the bias offset from a boundary between the first pattern and the opaque defect, and a second pattern repaired region extending into the second pattern in the first direction by the absolute value of the second quantity of the bias offset from a boundary between the second pattern and the opaque defect.

Preferably, according to a twelfth aspect of the invention, in the photomask manufacturing method, the first and second pattern repaired regions each have, in the second direction, a width larger than the second width.

A thirteenth aspect of the invention is directed to a semiconductor device comprising: a semiconductor substrate; and an integrated circuit pattern obtained on the basis of a resist pattern obtained by transferring the patterns onto the semiconductor substrate by using a photomask manufactured by the photomask manufacturing method of the eleventh aspect.

A fourteenth aspect of the invention is directed to a photomask comprising: a quartz glass; and a pattern composed of a metal film formed on a surface of the quartz glass, wherein part of one edge of the pattern is missing.

Preferably, according to a fifteenth aspect of the invention, the photomask further comprises: another pattern formed on the surface of the quartz glass, composed of a metal film, and adjacent to the pattern, wherein part of an edge of the additional pattern which faces to the one edge of the pattern is also missing.

A sixteenth aspect of the invention is directed to a semiconductor device comprising: a semiconductor substrate; and an integrated circuit pattern obtained on the basis of a resist pattern obtained by transferring the pattern onto the semiconductor substrate by using the photomask of the fourteenth aspect.

According to the first and eleventh aspects of the invention, a reduction in transmittance in the repaired defect portion can be appropriately corrected, so that the dimensional variation on the resist pattern formed by transferring the repaired pattern on the photomask can be restrained within a range permitted for the device quality.

According to the second and twelfth aspects of the invention, the absolute value of the quantity of bias offset of repairing can be set relatively small so that the repaired portion can be prevented from being detected as a defect after the repair of the opaque defect.

According to the third aspect of the invention, the opaque defect is completely removed by the irradiation of beam, part of the pattern in the pattern repaired region is removed together and the quartz glass portion right under it is exposed. Accordingly, when transferring the repaired pattern on the photomask to a resist on a semiconductor substrate, the light is transmitted through the exposed quartz glass portion, by diffraction etc., also upon the resist layer located right under the quartz glass portion from which the opaque defect has been removed (a repaired defect portion). This completely compensates for the reduction in transmittance in the repaired defect portion and the resist layer can be exposed to the light as if the transmittance were not reduced. The resist pattern thus obtained by transfer coincides with the original resist pattern to be obtained.

According to the fourth aspect of the invention, the reduction in transmittance in the quartz glass portion right under the remainder and in the repaired defect portion can be appropriately corrected, so that the dimensional variation on the resist pattern formed by transferring the repaired pattern on the photomask can be suppressed within a range permitted for the device quality.

According to the fourteenth and sixteenth aspects of the invention, when transferring the pattern on the photomask to a resist layer, the light can be transmitted through the missing portion in one edge of the pattern by diffraction etc., upon the resist layer right under the quartz glass portion between adjacent pattern edges to contribute to exposure of the layer. It is thus possible to obtain a semiconductor device in which the dimensional variation on the finally produced resist pattern and the integrated circuit pattern formed on the basis of the resist pattern is suppressed to zero or within a permissible range required in accordance with the design pattern dimensions of the semiconductor device.

The present invention has been made to solve the problems described above, and objects of the present invention are to provide: 1) a photomask manufacturing method which can compensate for reduction in transmittance in an opaque defect repaired portion (particularly an isolated opaque defect existing in area where metal film pattern portions are arranged in close proximity or an opaque extension defect) in a metal film pattern on a common photomask so as to suppress dimensional variation of the repaired portion on the pattern formed on a semiconductor wafer in a photomechanical process, 2) a photomask manufacturing method which can compensate for a reduction in transmittance in an opaque defect repaired portion (particularly an isolated opaque defect existing in an area where metal film pattern portions are arranged in close proximity or an opaque extension defect) in a metal film pattern on a phase shift photomask so as to suppress dimensional variation of the repaired portion on the pattern formed on a semiconductor wafer in a photomechanical process, and 3) the metal film pattern structure on the photomask manufactured by using the method 1) or 2).

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

This preferred embodiment is directed to a photomask having a pattern of metal film of CrON formed as linear interconnection pattern on the surface of quartz glass, and particularly to a method for manufacturing a photomask in which opaque extension defects among opaque defects formed during production of the photomask pattern can be appropriately repaired so that the photomask pattern can be transferred onto a semiconductor wafer without causing the dimensions of the resist pattern (finally, of the integrated circuit pattern) to vary over the permissible range. This preferred embodiment also shows a structure of the metal film interconnection pattern formed after repair/removal of the opaque extension defects. The method for repairing opaque extension defects and the principle of the repair will be described first.

Figure 1:
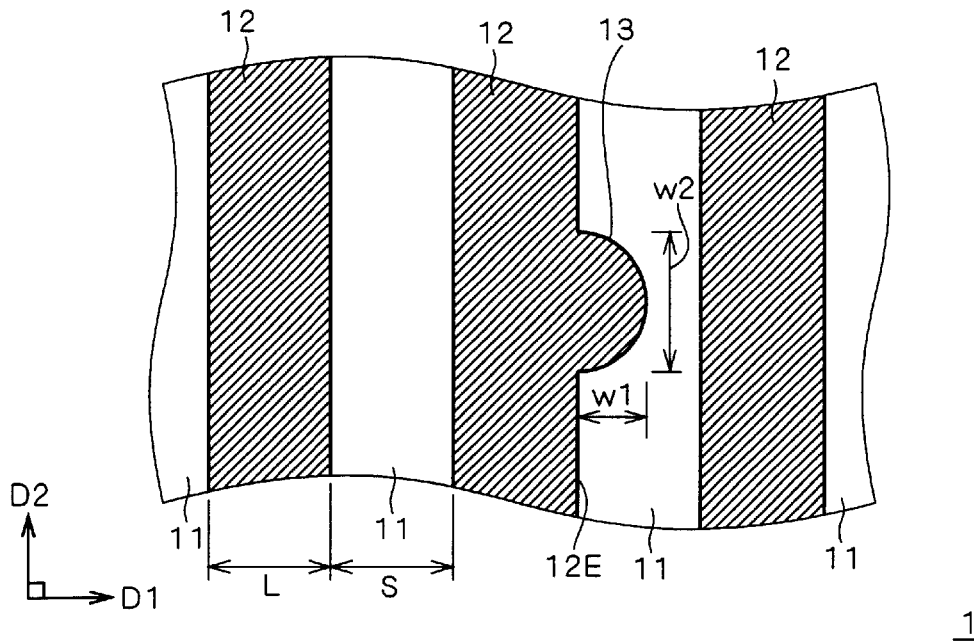
FIG. 1 is a plane view showing an opaque extension defect connected to one edge of a linear metal film interconnection pattern on a CrON photomask.

FIGS. 1 to 7 show an example of an opaque extension defect formed on a photomask having about 0.1-μm-thick film of CrON formed as a metal-film linear interconnection pattern on a surface of quartz glass; the opaque extension defect is repaired by using a pulse laser light (e.g. a YAG laser light) with a wavelength of about 530 nanometers, an output of about 1 millijoules/pulse, and a pulse width of about 0.8 nanoseconds to 0.9 nanoseconds. The diagrams are drawn as plane views of the photomask. Among the drawings, FIG. 1 shows the surface structure of a photomask 10 before repair of the opaque defect. As shown in this drawing, a plurality of lines of interconnection pattern 12 formed on the quartz glass surface of the photomask 10 have an interconnection pattern width L and an interconnection pattern interval S of about 1 μm in a first direction D1, and they are made of CrON metal film and arranged in parallel to each other along a second direction D2 perpendicular to the first direction D1. Now it is assumed that an opaque extension defect 13 having a width (first width) w1 (=about 0.5 μm) in the first direction D1 and a width (second width) w2 in the second direction D2 exists in the quartz glass portion 11 between adjacent lines of the interconnection pattern 12. This opaque extension defect 13 is connected to part (a boundary) of one edge 12E of the line of interconnection pattern 12.

Figure 2:
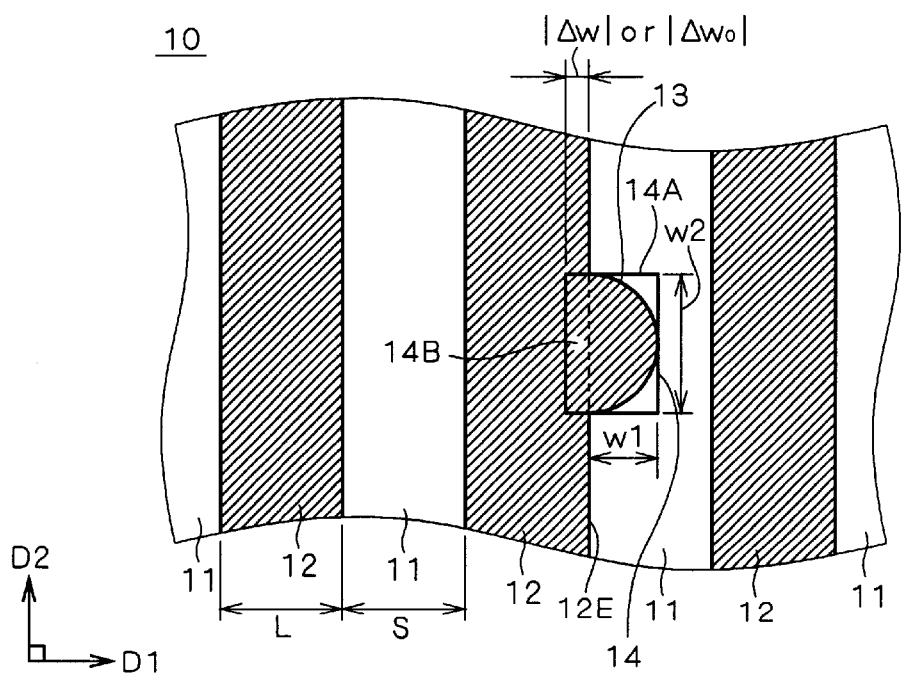
FIG. 2 is a plane view showing a beam irradiation region according to a first preferred embodiment of the present invention.

In this preferred embodiment, as shown in FIG. 2, a beam irradiation region 14 in which the quartz glass surface of the photomask 10 is irradiated with a laser light is set to include: (1) a rectangular irradiation region (which corresponds to the irradiation region in the conventional art) 14A containing the opaque extension defect 13 and having the width (third width) w1 in the first direction D1 and the width (fourth width) w2 in the second direction D2, and (2) a rectangular pattern repaired region 14B extending into the interconnection pattern 12 from the boundary between the opaque extension defect 13 and any line of the interconnection pattern 12 (hereinafter merely referred to as the interconnection pattern 12) which corresponds to the extension of the edge 12E of the interconnection pattern 12, where the region 14B extends by the absolute value of a quantity of bias offset of repairing $\Delta w$ (or an optimum quantity of bias offset of repairing $\Delta w_0$) in the minus direction in the first direction D1 and has the width w2 in the second direction D2. That is to say, the irradiation region 14A used in the conventional repair method is corrected (or enlarged) in the first direction D1 on the basis of the quantity of bias offset of repairing $\Delta w$ (or the optimum quantity of bias offset of repairing $\Delta w_0$) to set the appropriate beam irradiation region 14.

Figure 3:
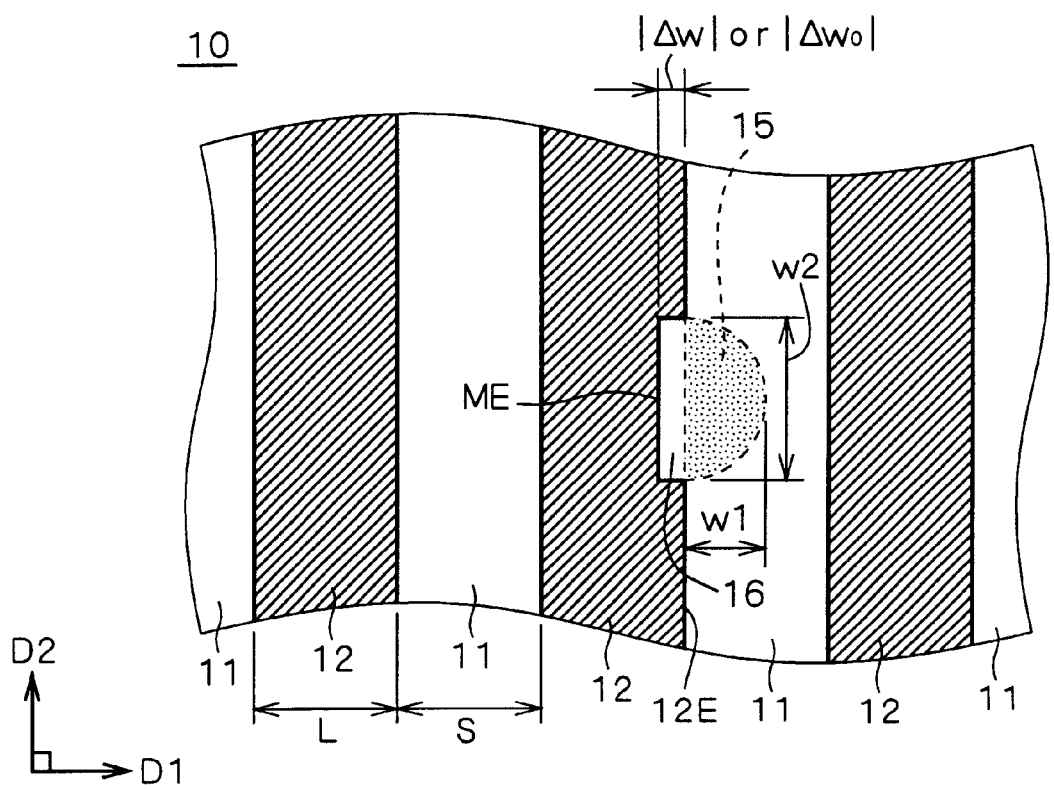
FIG. 3 is a plane view showing the photomask obtained after the opaque extension defect has been removed by irradiating the beam irradiation region shown in FIG. 2 with a laser light.

Next, laser light is applied in the beam irradiation region 14 of FIG. 2 to remove the opaque extension defect 13 and the CrON film existing in the region 14. FIG. 3 shows the surface structure of the photomask 10 obtained after removal. As shown in this diagram, the part ME of the one edge 12E of the repaired interconnection pattern 12 which faces to the portion 15 of the quartz glass portion 11 from which the opaque extension defect has been removed (referred to as a repaired defect portion) is recessed from the original position of the edge 12E in the minus direction in the first direction D1. In other words, part of the one edge 12E is missing in the particular interconnection pattern 12 on the photomask 10 from which the opaque extension defect was removed, and the interconnection pattern 12 has a recessed portion 16 having a width equal to the absolute value of the quantity of bias offset of repairing $\Delta w$ (or the optimum quantity of bias offset of repairing $\Delta w_0$) and the width w2 respectively in the first direction D1 and the second direction D2. While photomechanical process is performed by using the photomask 10 having this interconnection pattern 12, the photomask 10 is adopted for the following reason or in the following point of view.

As has been already described, when subjected to the laser light irradiation, the opaque extension defect made of the CrON metal film absorbs energy of the laser light and is thus heated and removed through evaporation. In this process, the part of the quartz glass corresponding to the repaired defect portion, or the base underneath the removed opaque extension defect, is also heated to high temperature and therefore the surface of the part of the quartz glass corresponding to the repaired defect portion becomes rough with small irregularities (i.e. damaged). This causes the transmittance in the repaired defect portion 15 (FIG. 3) to become lower than that in the quartz glass portion free of opaque defects. For example, when an opaque extension defect is repaired and removed by using a laser light under the output conditions mentioned above, and if the transmittance in the defect-free portion of the quartz glass is taken as 100, then the transmittance in the repaired defect portion 15 was 92 in the case of a wavelength of 248 nm and 96 in the case of a wavelength of 365 nm.

Figure 28:
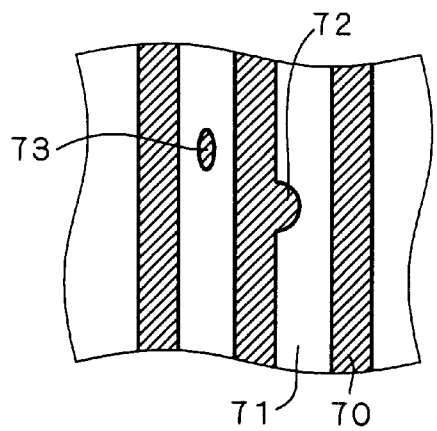
FIG. 28 is a plane view showing opaque defects connecting with metal film interconnection patterns on a photomask.
Figure 29:
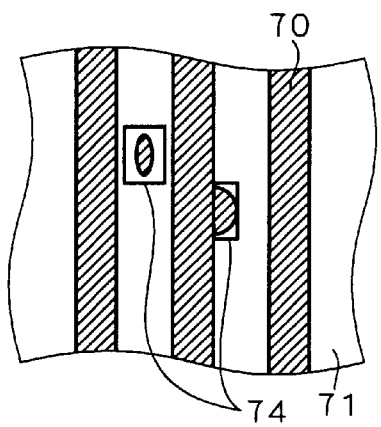
FIG. 29 is a plane view showing conventional regions to be irradiated with a laser light or an ion beam.
Figure 30:
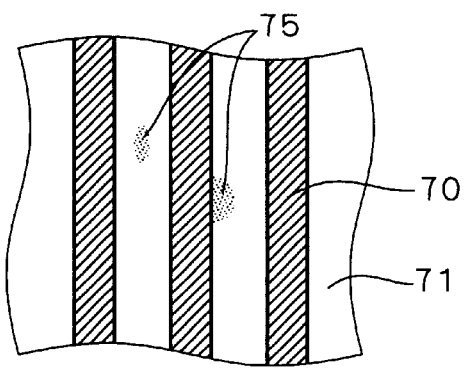
FIG. 30 is a diagram showing the conventional pattern structure obtained after it has been repaired by a conventional repair method.
Figure 31:
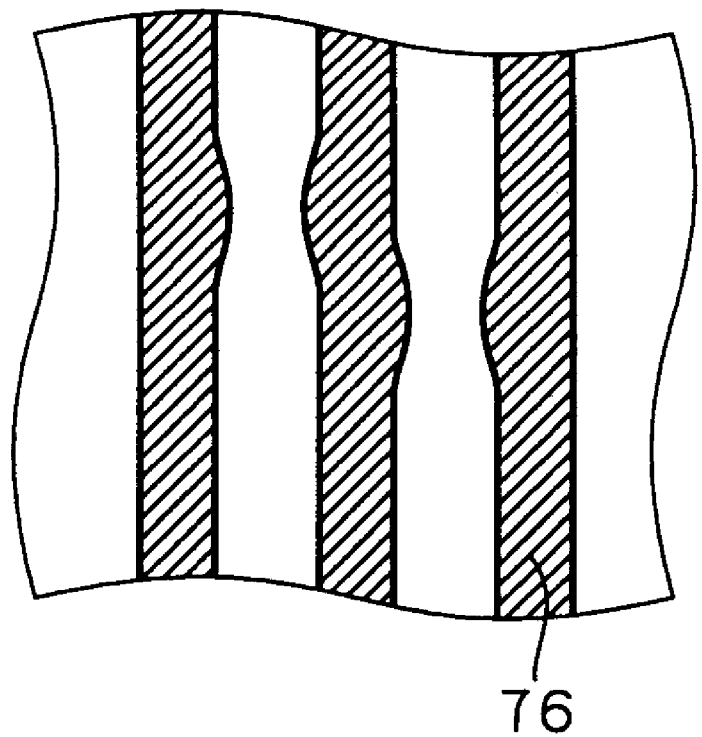
FIG. 31 is a plane view showing a conventional resist pattern formed by transferring the photomask pattern shown in FIG. 30 onto a wafer.

The reduction in transmittance in the repaired defect portion 15 can be compensated for by taking the following measure when transferring the interconnection pattern 12 on the photomask 10 to the resist on a semiconductor wafer. That is to say, the reduction in intensity of the light reaching the resist portion right under the portion 15 directly through the portion 15 can be made up for by allowing a larger quantity of light to enter the resist portion right under the portion 15 from the periphery of the portion 15 by diffraction or scattering. It is considered that such compensation for the reduction in quantity of light was made also in the conventional defect repair method shown in FIG. 29 by the light transmitted through the quartz glass portions 71 (FIG. 28) around the repaired defect portions 75 (FIG. 30). However, it is supposed that the compensation was insufficient. For this reason, the photomask 10 in which part of the edge 12E of the interconnection pattern 12 is positively removed is produced as shown in FIG. 3. That is to say, the portion of the quartz glass lying right under the recessed portion 16 (this part is referred to as a quartz glass portion 16) in the interconnection pattern 12 is newly exposed after the irradiation of laser light. Then, when the pattern 12 is transferred onto the semiconductor wafer, part of the light transmitted through the quartz glass portion 16 enters the resist portion right under the repaired defect portion 15 through diffraction or scattering, thus allowing the resist portion to be irradiated with an increased quantity of light. This increase in quantity of light is positively utilized to compensate for the reduction in quantity of light due to the transmittance reduction. In this case, the quartz glass portion 16 of FIG. 3 is also damaged during the irradiation of laser light and therefore the transmittance in the portion 16 also decreases, which reduces the quantity of light incident upon the resist portion right under the portion 16 in the transfer process. It is supposed that the quantity of supplementary light from the periphery of the portion 16 is smaller than that in the repaired defect portion 15.

Figure 4A:
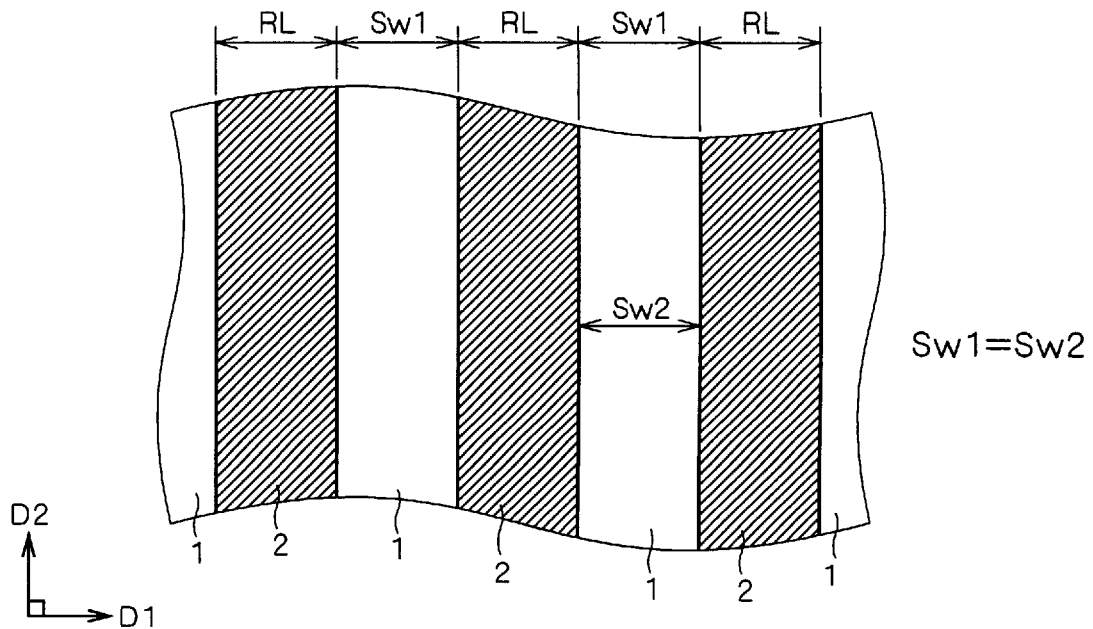
FIGS. 4A, 4B and 5 are plane views showing semiconductor devices each having a resist pattern formed by transferring the interconnection pattern on the photomask shown in FIG. 3 to a resist layer.

From this point of view, in transfer, there must be such an optimum quantity of correction offset $\Delta w_0$ that can make the following two quantities equal: (1) the quantity of reduction of the light incident upon the resist portion right under the repaired defect portion 15 through the portion 15 and (2) the quantity (an increase) of the light incident upon that resist portion through the quartz glass portion 16 and the quartz glass portion 11 around the repaired defect portion 15. Accordingly, in transfer, the resist pattern shown in FIG. 4A (Sw1=Sw2) can be obtained by obtaining the optimum quantity of bias offset of repairing $\Delta w_0$ in advance through trials. FIG. 4A is a plane view showing a semiconductor device 100 having a resist pattern 2 obtained by transferring the interconnection pattern 12 of the photomask 10 to a positive resist formed on a semiconductor wafer or semiconductor substrate 1 by using the photomask 10 obtained by applying laser light irradiation to the beam irradiation region 14, where the region 14 is set to include the irradiation region 14A and the pattern repaired region 14B extending in the minus direction in the first direction D1 by the absolute value of the optimum quantity of bias offset of repairing $\Delta w_0$ as shown in FIG. 2. In this drawing, the character Sw1 shows the original resist pattern interval in the portion having no opaque defect and the character Sw2 shows the resist pattern interval in the portion corresponding to the repaired defect portion 15 in FIG. 3, and Sw1=Sw2 in this case.

Herein, the sign of the quantity of bias offset of repairing $\Delta w$ is represented as minus when one edge of the interconnection pattern, after being repaired, is recessed from the position of the original pattern edge in the minus direction in the first direction D1, and it is represented as plus when the defect portion remains in the vicinity of the boundary, that is, when the pattern edge after repaired protrudes from the original pattern edge in the plus direction in the first direction D1. Accordingly, FIGS. 3 and 4A and FIGS. 4B and 5 that will be described later are examples in which the quantity of bias offset of repairing $\Delta w$ has minus sign.

Figure 4B:
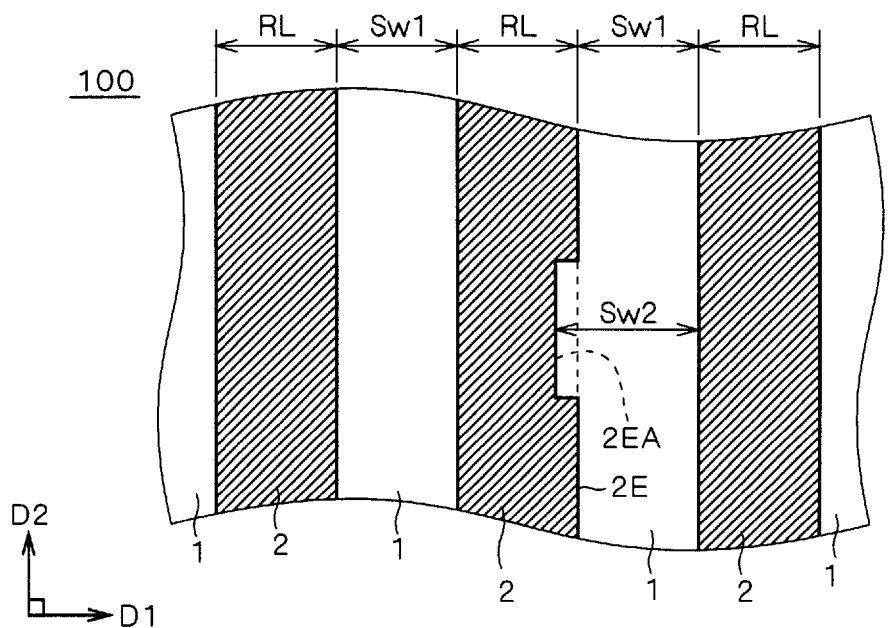

When the quantity of bias offset of repairing Δw is set as Δw<Δw₀<0, because the area of the quartz glass portion 16 of FIG. 3 is more increased, the reduction in transmittance in the portion 16 is partially compensated for by the increase also in the portion 16, so that a missing or recessed portion is formed in the edge 2E on the transferred resist pattern 2 as shown in FIG. 4B. Then the edge portion 2EA corresponding to the repaired defect portion 15 is recessed and the resist pattern interval Sw2 becomes larger than the original resist pattern interval Sw1.

Figure 5:
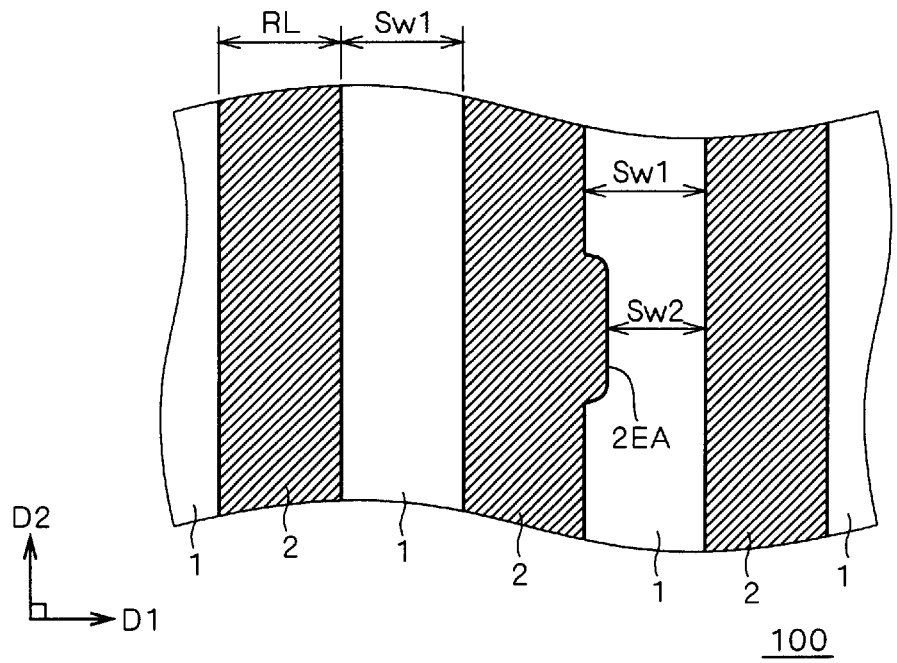

On the other hand, when the quantity of bias offset of repairing Δw is set as Δw₀<Δw<0, the reduction in transmittance is not completely compensated for not only in the quartz glass portion 16 but also in part of the repaired defect portion 15 (the part near the boundary), and then the resist pattern interval Sw2 becomes smaller than the resist pattern interval Sw1 as shown in FIG. 5.

As described above, it will be the most effective in the laser light irradiation to control the optical system on the optical path of the laser light so that the quantity of bias offset of repairing Δw is equal to the optimum quantity of bias offset of repairing Δw₀. However, opaque extension defects may be repaired by the irradiation of laser light as follows, even if the quantity of bias offset of repairing Δw is not equal to the optimum quantity of bias offset of repairing Δw₀. That is to say, a given range (permissible range) of the quantity of bias offset of repairing Δw is obtained so that the variation rate of the actual resist pattern interval Sw2 with respect to the original resist pattern interval Sw1, (Sw2−Sw1)×100/Sw1 (%), falls within a permissible range determined in accordance with the device design pattern dimensions, and the optical system on the optical path of the laser light is controlled so that the laser light is applied inside the beam irradiation region determined by a quantity of bias offset of repairing Δw within the permissible range (control of the laser light beam).

Figure 6:
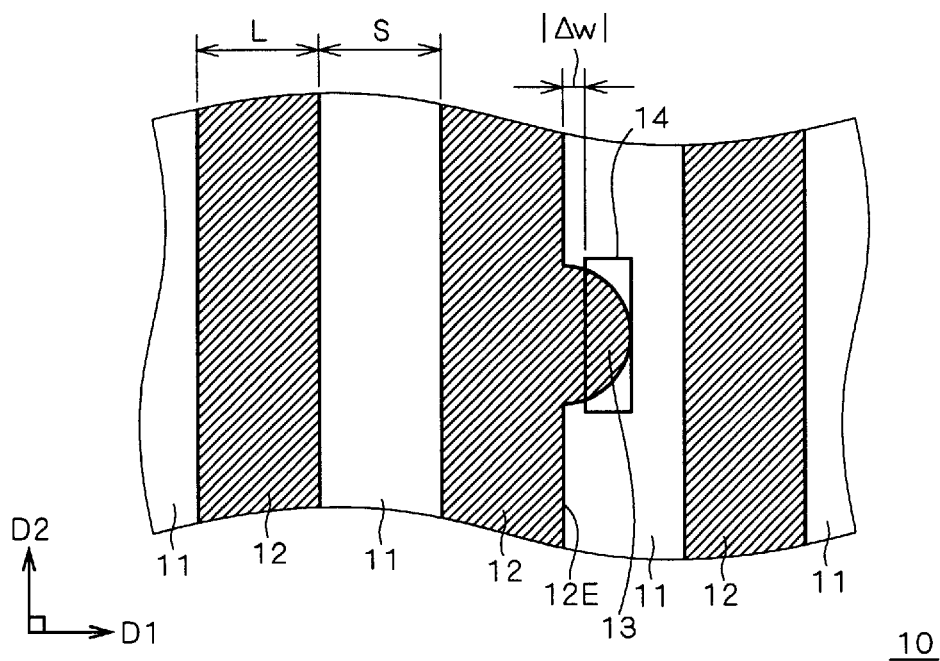
FIG. 6 is a plane view of the photomask showing a beam irradiation region set when the quantity of bias offset of repairing has a plus sign.

When the design pattern dimensions are relatively large, in which case the variation in resist pattern dimensions is not a serious problem in the background art, the opaque extension defects can be repaired with the quantity of bias offset of repairing Δw having a plus sign. Note that the optimum quantity of bias offset of repairing Δw₀ is 0 μm. FIG. 6 is a plane view showing a beam irradiation region 14 on the photomask 10 in this case. In this case, as shown in the diagram, the beam irradiation region 14 is given as an area obtained by narrowing the original irradiation region 14A shown in FIG. 2 by the absolute value of the quantity of bias offset of repairing Δw in the first direction D1. Accordingly, part of the opaque extension defect 13 remains unremoved after the irradiation of laser light, and it is left as a region protruding by the absolute value of the quantity of bias offset of repairing Δw on the plus side in the first direction D1 from the connection or boundary between the opaque extension defect 13 and the one edge 12E of the interconnection pattern 12.

Figure 7:
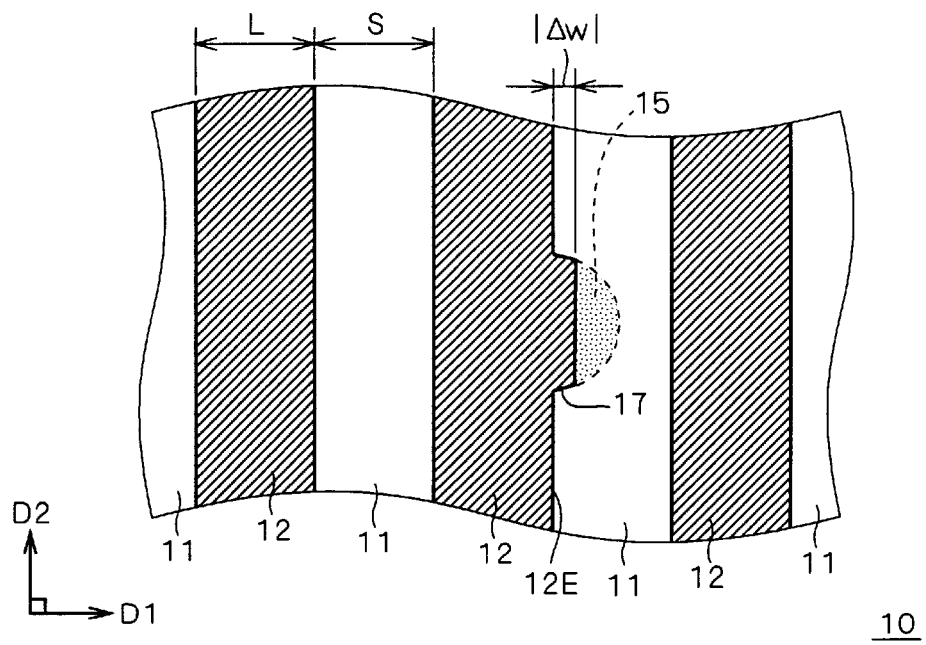
FIG. 7 is a plane view showing the photomask obtained after part of the opaque extension defect has been removed by irradiating the beam irradiation region shown in FIG. 6 with a laser light.

FIG. 7 schematically shows the plane structure of the photomask 10 subjected to such opaque extension defect repair. As shown in the diagram, the remainder 17 of the opaque extension defect 13 connects with the one edge 12E of the interconnection pattern 12.

It is supposed that even if such a photomask 10 is used, the shortage of the quantity of light caused by the reduction in transmittance in the repaired defect portion 15 and the presence of the remainder 17 can be sufficiently offset when the design pattern dimension is relatively large (for example, about 3 μm or larger on a photomask). That is to say, the area of the quartz glass portion 11 around the repaired defect portion 15 of FIG. 7 is relatively large in this case, so that, when transferring the interconnection pattern 12 of FIG. 7 to the resist on a semiconductor wafer by photolithography, a relatively large quantity of light enters the resist portion right under the repaired defect portion 15 and the remainder 17 through the quarts glass portion 11 around the repaired defect portion 15. Accordingly, when the absolute value of the quantity of bias offset of repairing Δw (>0) is appropriately set, the dimensional variation rate of the resist pattern transferred with respect to the dimensions of the original resist pattern can fall within the given permissible range. In this case, the quantity of bias offset of repairing Δw is given as a value within a permissible range of variation from the optimum quantity of bias offset of repairing Δw₀ corresponding to zero value.

Now results of trial photomasks obtained on the basis of the above-described photomask opaque extension defect repair method will be described.

Figure 8:
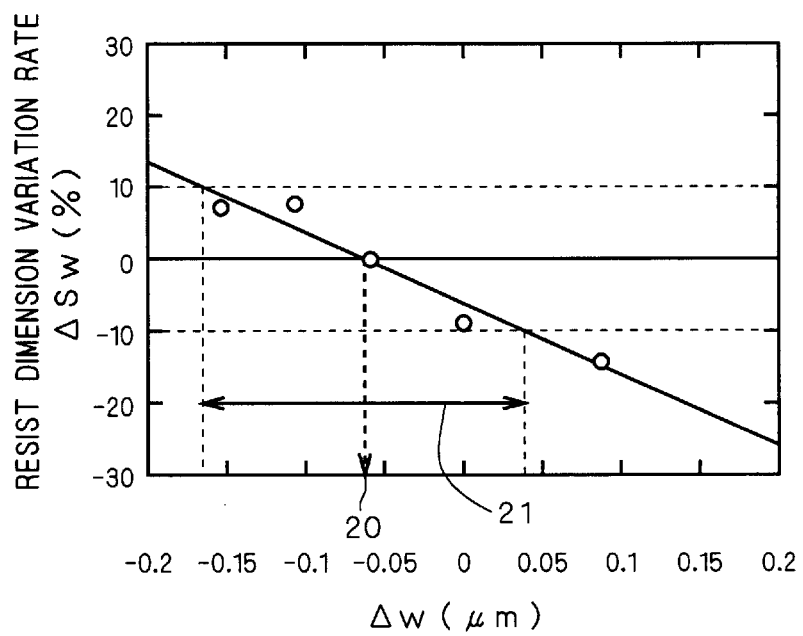
FIG. 8 is a diagram showing the relation between the quantity of bias offset of repairing and the rate of dimensional variation on a resist pattern formed by transferring a repaired metal film interconnection pattern onto a semiconductor wafer, which was obtained in an example where, in a metal film interconnection pattern formed on a CrON photomask and having an interconnection width and interconnection interval in a first direction both equal to about 1 $\mu$m, a 0.5-$\mu$m-wide opaque extension defect continuous with one edge of the metal film pattern was repaired by using a laser light.

First, on interconnection patterns formed of CrON film on quartz glass with the width L and the interval S both equal to about 1 μm, an opaque extension defect 13 (see FIG. 1) having the width w1 and the width w2 both equal to 0.5 μm and continuous with one edge of one of the interconnection patterns was repaired on the basis of the above-described opaque extension defect repair method with varied quantities of bias offset of repairing Δw under the above-mentioned laser light output conditions, and the relation between the quantity of bias offset of repairing Δw and the dimensional variation rate ΔSw of the resist pattern 2 (see FIG. 4) on a semiconductor wafer (which is given as (Sw2−Sw1)×100/Sw1) was actually measured. The results of the measurements are shown in FIG. 8. As shown in the diagram, the dimensional variation rate ΔSw of the resist pattern on the semiconductor wafer is zero % when the quantity of bias offset of repairing Δw is about −0.06 μm. Accordingly, the optimum quantity of bias offset of repairing 20 can be valued at about −0.06 μm. In order to control the dimensional variation rate ΔSw within the variation range (corresponding to the given permissible range) of ±10% with respect to the resist pattern dimension Sw1 in the opaque-defect-free areas on the photomask, for example, the permissible quantity 21 of the quantity of bias offset of repairing Δw was in the range from about +0.04 μm to −0.16 μm (note that Δw=0 is excluded).

Figure 9A:
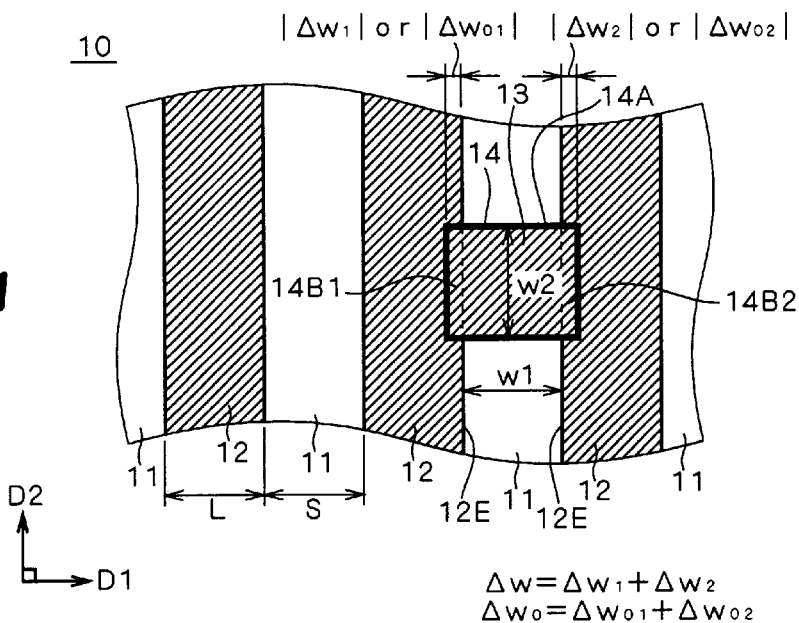
FIG. 9A is a plane view of a photomask showing an example of a beam irradiation region for repairing and removing a bridge defect.

Next, when the opaque extension defect 13 continuous with an edge of the interconnection pattern 12 having the width L and the interval S (FIG. 1) both equal to 1 μm has the width dimensions w1 and w2 both equal to 1 μm or the width dimension w1 of 1 μm and the width dimension w2 of 3 μm, the adjacent interconnection patterns 12 on both sides of the opaque extension defect 13 are connected by the opaque extension defect 13. Accordingly the opaque extension defect 13 in this case is called a bridge defect. Also in this case, it is possible to restrain the dimensional variation rate of the resist pattern formed on the semiconductor wafer within a permissible range including zero value by applying the opaque extension defect repair method described referring to FIGS. 1 to 7. In this case the opaque extension defect repair method is applied to one line or both lines of the interconnection pattern to cause the edge or edges of the repaired interconnection pattern to be recessed (when the quantity of bias offset of repairing Δw<0) or to protrude (when Δw>0) from the original position or positions, so as to compensate for the transmittance reduction in the repaired defect portion 15 (FIG. 3, FIG. 7). FIG. 9A shows an example in which the boundaries between the edges 12E of both lines of interconnection pattern 12 and the bridge defect 13 are respectively recessed by the absolute value of a first quantity of bias offset of repairing $\Delta w_1$ and the absolute value of a second quantity of bias offset of repairing $\Delta w_2$. Note that the sum of the absolute value of the first quantity of bias offset of repairing $\Delta w_1$ and the absolute value of the second quantity of bias offset of repairing $\Delta w_2$ is equal to the absolute value of the quantity of bias offset of repairing $\Delta w$ described above. The same idea applies to the optimum quantity of bias offset of repairing $\Delta w_0$, and the sum of the absolute value of a first optimum quantity of bias offset of repairing $\Delta w_{01}$ and the absolute value of a second optimum quantity of bias offset of repairing $\Delta w_{02}$ is equal to the absolute value of the optimum quantity of bias offset of repairing $\Delta w_0$. In FIG. 9A, the reference characters 14A, 14B1 and 14B2 are the irradiation region, a first pattern repaired region, and a second pattern repaired region, respectively. The width w1 corresponds to "the first width" and "the third width," and the width w2 corresponds to "the second width" and "the fourth width." Where "fourth width"≧"second width."

Figure 9B:
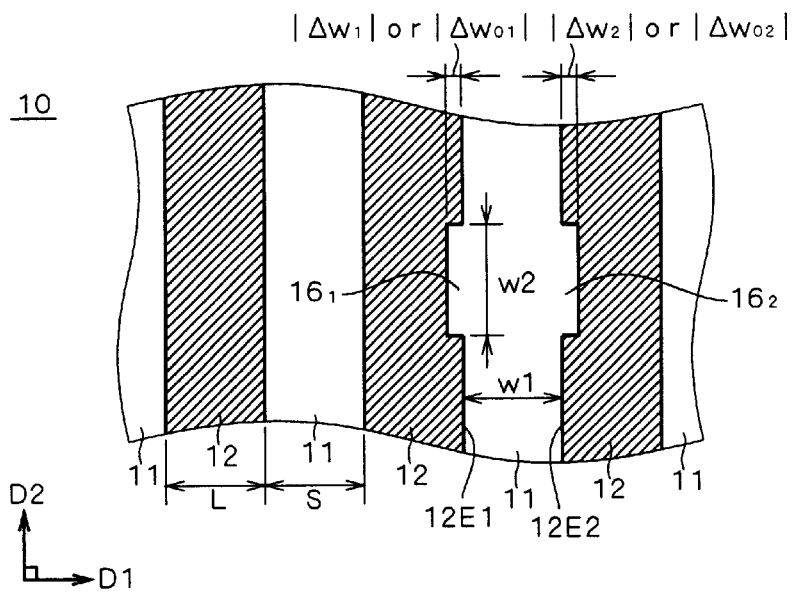
FIG. 9B is a plane view showing an example of a photomask obtained after the bridge defect has been repaired and removed.

FIG. 9B is a plane view showing the photomask 10 subjected to the bridge defect repair method shown in FIG. 9A. In FIG. 9B, the reference characters 12E1, 12E2, $16_1$ and $16_2$ are one edge of the first pattern, one edge of the second pattern that faces to the edge 12E1 of the adjacent first pattern, a first recessed portion or first missing portion, and a second recessed portion or second missing portion, respectively.

Figure 9C:
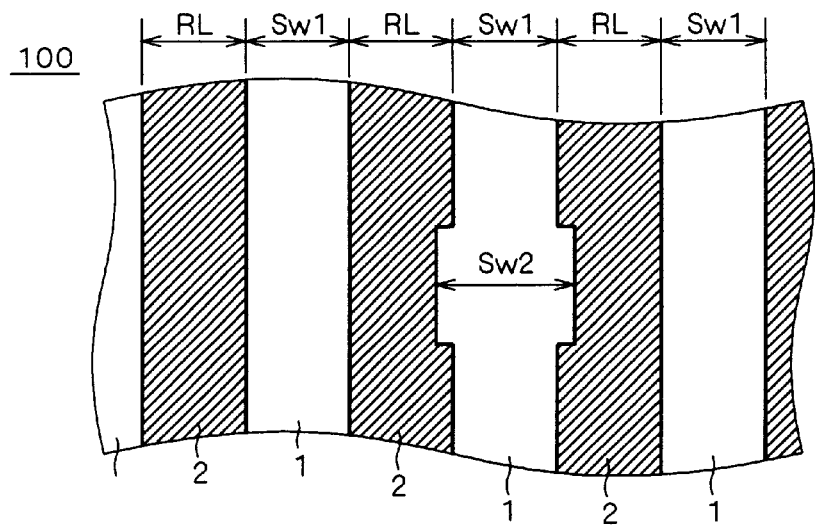
FIG. 9C is a plane view showing a semiconductor device having a resist pattern formed by using the photomask shown in FIG. 9B.

FIG. 9C is a plane view showing a semiconductor device 100 having a resist pattern 2 transferred by using the photomask 10 shown in FIG. 9B.

Figure 10:
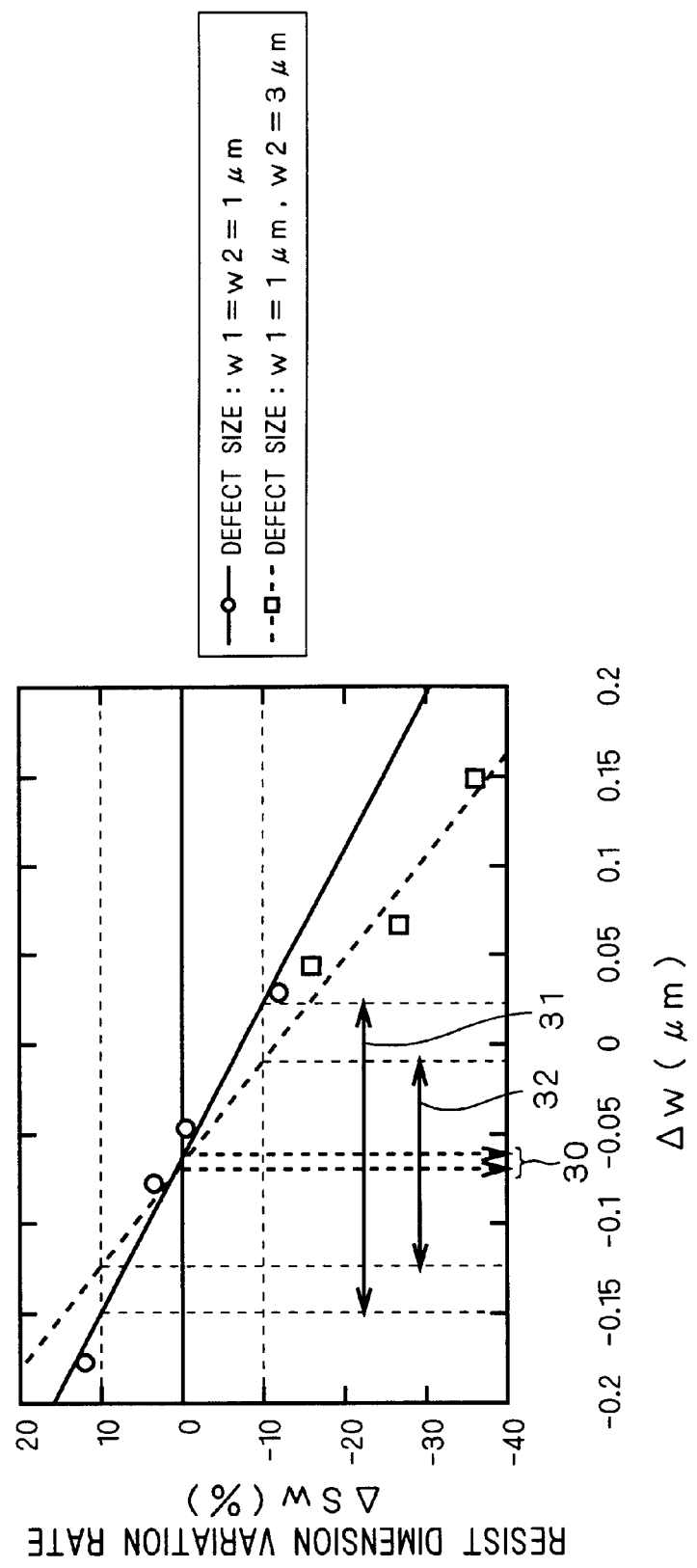
FIG. 10 is a diagram showing the quantity of bias offset of repairing and the dimensional variation rate of a resist pattern formed by transferring a repaired metal film pattern onto a semiconductor wafer, which was obtained in examples where, in two adjacent metal film interconnection patterns formed on a CrON photomask and having an interconnection width and interconnection interval in a first direction both equal to about 1 μm, opaque extension defects continuous with the respective edges of the interconnection patterns and respectively having width dimensions of 1 μm and 3 μm in the second direction were repaired by using a laser light.

Also in the examples of repairing bridge defects having the width w2 of 1 μm or 3 μm as shown in FIG. 9A (w1=1 μm in both cases and the dimensions L and S of the interconnection pattern and the output conditions of the laser light were the same as those mentioned above), the dimensional variation rate ΔSw of the resist pattern formed on the semiconductor wafer with respect to the quantity of bias offset of repairing Δw was measured with the quantity of bias offset of repairing Δw (=$\Delta w_1$+$\Delta w_2$) varied. FIG. 10 shows the summary of the measurements. The bridge defect was repaired as shown in FIG. 9A and the quantity of opaque extension offset Δw in this case is equal to the sum of the first and second quantities of opaque extension offset $\Delta w_1$ and $\Delta w_2$ about the respective edges 12E of the patterns 12 on both sides shown in FIG. 9A. As can be clearly seen from the diagram, the optimum quantity of bias offset of repairing 30 is about –0.07 μm for both of the defect sizes (=w2) of 1 μm and 3 μm, in which case the dimensional variation rate ΔSw of the resist pattern on the semiconductor wafer is zero %.

Figure 11:
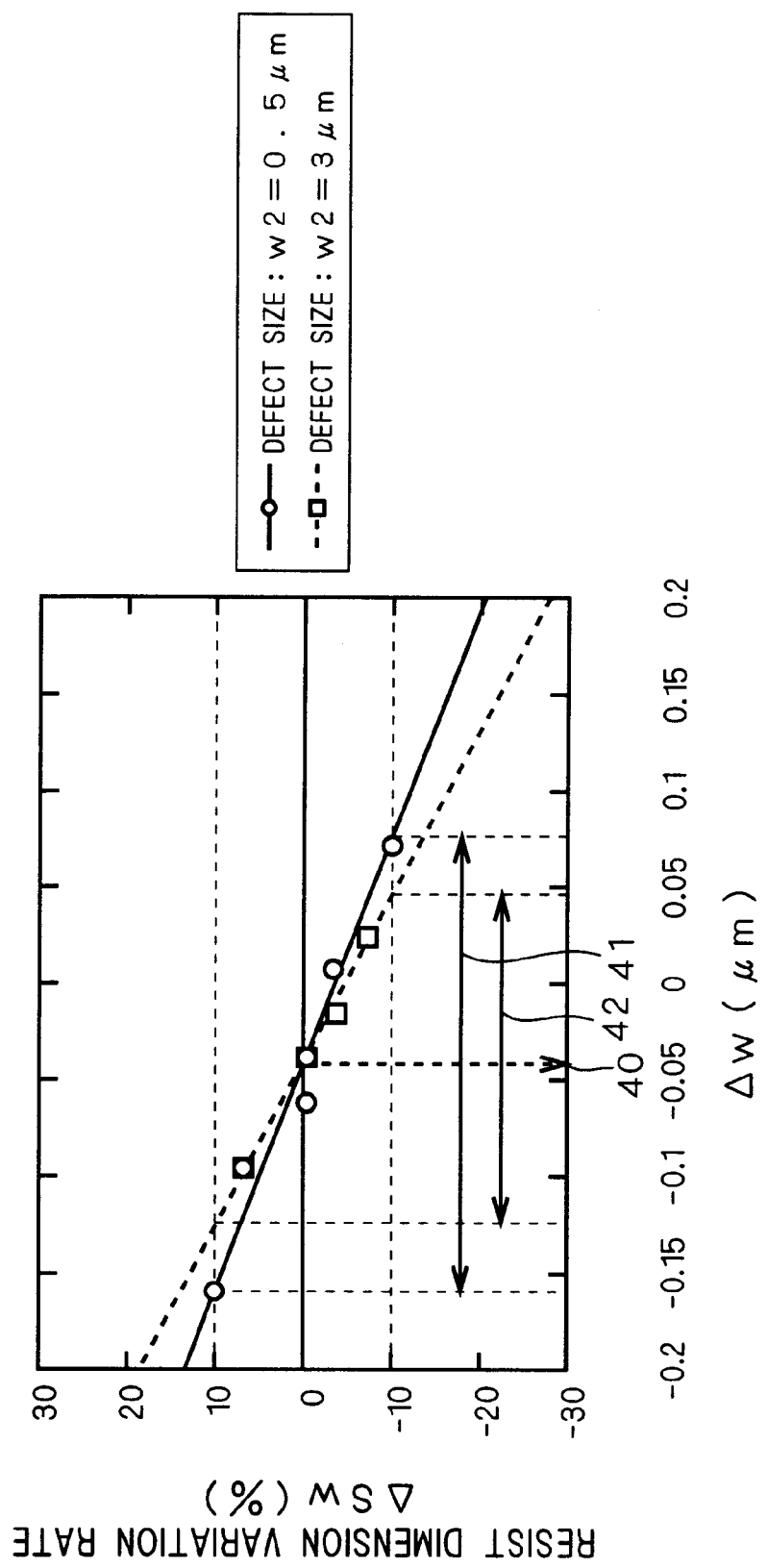
FIG. 11 is a diagram showing the quantity of bias offset of repairing and the dimensional variation rate of a resist pattern formed by transferring a repaired metal film interconnection pattern to a semiconductor wafer, which was obtained in an example where, in two adjacent metal film interconnection patterns formed on a CrON photomask and having an interconnection width and interconnection interval in a first direction both equal to about 1.2 μm, opaque extension defects continuous with the metal film interconnection patterns and respectively having width dimensions of 0.5 μm and 3 μm in the second direction were repaired by using a laser light.

As already stated, the reduction in transmittance caused in the repaired defect portion can be appropriately compensated for by diffraction and scattering of the light transmitted through the light transmitting area (the quartz glass portion) around that portion. Accordingly if the area of the portion having the reduced transmittance is unchanged, the optimum quantity of bias offset of repairing $\Delta w_0$ becomes smaller as the interconnection interval S of FIG. 1 becomes larger, because the repaired defect portion 15 is surrounded by larger quartz glass portion 11 free from transmittance reduction. Considering this point, on an interconnection pattern having the interconnection width L and the interconnection interval S both equal to about 1.2 μm, an opaque extension defect (w1=w2=0.5 μm) and a bridge defect (w1=1.2 μm, w2=3 μm) continuous with an edge or edges of the interconnection pattern were repaired on the basis of the above-described repair method under the same laser light output conditions, and the relation between the quantity of bias offset of repairing Δw and the dimensional variation rate ΔSw of the resist pattern on the semiconductor wafer was actually measured. FIG. 11 shows the summary of the measurements. The bridge defect was repaired as shown in FIG. 9A, where the quantity of bias offset of repairing Δw in this case was equal to the sum of the first and second quantities of bias offset of repairing $\Delta w_1$ and $\Delta w_2$ about the respective edges 12E of the lines of pattern 12 on both sides shown in FIG. 9A. As is clear from FIG. 11, the optimum quantity of bias offset of repairing $\Delta w_0$ was about –0.04 μm in both cases, which is smaller than the optimum quantity of bias offset of repairing $\Delta w_0$ obtained when the interconnection width L and the interconnection interval S were both 1 μm (FIG. 10).

The accuracy or permissible range of the quantity of bias offset of repairing Δw required to make the dimensional variation rate of the resist pattern on the semiconductor wafer fall within the permissible range of the semiconductor device is mainly related to the size of the opaque extension defects. FIG. 10 and FIG. 11 described above also show the accuracy of the quantity of bias offset of repairing Δw required when the dimensional variation of the resist pattern is permitted within ±10% around the center value. As is understood from FIGS. 10 and 11, the permissible range of the variation in the quantity of bias offset of repairing (Δw) becomes smaller as the defect size (=w2) becomes larger. For example, as shown in FIG. 10, when a bridge defect is repaired between lines of interconnection pattern having the interconnection interval S of 1 μm, the permissible range 31 of the quantity of bias offset of repairing Δw is in the range from –0.15 μm to –0.02 μm when the defect size (=w2) of the bridge defect is 1 μm. However, when the defect size (=w2) is 3 μm, the permissible range 32 of the quantity of bias offset of repairing Δw is reduced to the range of –0.13 μm to –0.01 μm. This relation also applies to the permissible ranges 41 and 42 in FIG. 11.

Table 1 shows the relation between the interconnection pattern interval S and the optimum quantity of bias offset of repairing $\Delta w_0$ in the case in which an opaque extension or bridge defect continuous with an edge or edges of interconnection pattern on a CrON photomask is repaired by the above method under the above laser light output conditions. Note that the size (w1, w2) of the opaque extension defects or bridge defects is not uniform for each piece of data in Table 1, where the width w1 is within the dimension S and the width w2 is in the range of about 0.5 μm to 3 μm, for example.

TABLE 1

| Interval S of photomask interconnection pattern | below 1 μm | 1 μm to 2 μm excl. | 2 μm or above |
|---|---|---|---|
| Optimum quantity of bias offset of repairing $\Delta w_0$ | –0.10 μm or below | –0.10 to –0.05 μm | –0.05 to 0 μm |

As shown in Table 1, the optimum quantity of bias offset of repairing $\Delta w_0$ is determined in accordance with the interval S, or the dimension S in the first direction D1 of the quartz glass surface region in which the opaque defect exists (needless to say, it also depends on the laser light output conditions and the defect size, but it depends on the interval S more largely here). For example, when 1 $\mu$m≦S<2 $\mu$m, the optimum quantity of bias offset of repairing $\Delta w_0$ is in the range of −0.10 $\mu$m to −0.05 $\mu$m.

Though not shown in Table 1, it is clear from the description above and FIGS. 10 and 11 and Table 1 that the permissible range of the quantity of bias offset of repairing $\Delta w$ (which includes the optimum quantity of correction offset $\Delta w_0$) required to control the dimensional variation rate of the transferred resist pattern within a given range (e.g. within ±10%) is similarly determined in accordance with the laser light beam output conditions, the interval S, and the defect size.

In this way, it is possible to minimize the dimensional variation of the resist pattern transferred on a semiconductor wafer caused by the reduction in transmittance in the repaired defect portion on the photomask, or to suppress the dimensional variation within a given range determined in accordance with the permissible range of the semiconductor devices (e.g. within ±10%), by applying a laser light beam to the beam irradiation region 14 (FIG. 2, FIG. 6) determined on the basis of the optimum quantity of bias offset of repairing $\Delta w_0$ shown in Table 1 or a quantity of bias offset of repairing $\Delta w$ in the permissible range including the optimum quantity of bias offset of repairing $\Delta w_0$.

Actually, the accuracy of positioning a repaired edge of an actual laser repair system has a variation in the range of about 0.1 $\mu$m to 0.2 $\mu$m. The opaque extension defects must be repaired so that the finally obtained interconnection pattern edge is recessed by the quantity of bias offset of repairing $\Delta w$ or the optimum quantity of bias offset of repairing $\Delta w_0$ ($\Delta w<0$ or $\Delta w_0<0$), or protrudes by the quantity of bias offset of repairing $\Delta w$ ($\Delta w>0$) required to suppresses the dimensional variation rate of the resist pattern on the semiconductor wafer within the permissible range of the semiconductor device. That is to say, considering the variation in the positioning accuracy of the laser repair system, the opaque extension defect is gradually removed from its end by gradually enlarging the laser light irradiation region in the first direction D1 from the end of the opaque extension defect that is the most distant from the connection between the opaque extension defect and the original interconnection pattern toward the connection, and the repair is ended when the laser light irradiation position reaches the position separated from the connection by the desired quantity of the bias offset of repairing $\Delta w$ or the optimum quantity of bias offset of repairing $\Delta w_0$. The procedure of repairing an opaque extension defect on the basis of the quantity of bias offset of repairing with an actual laser repair system will now be described.

Figure 12:
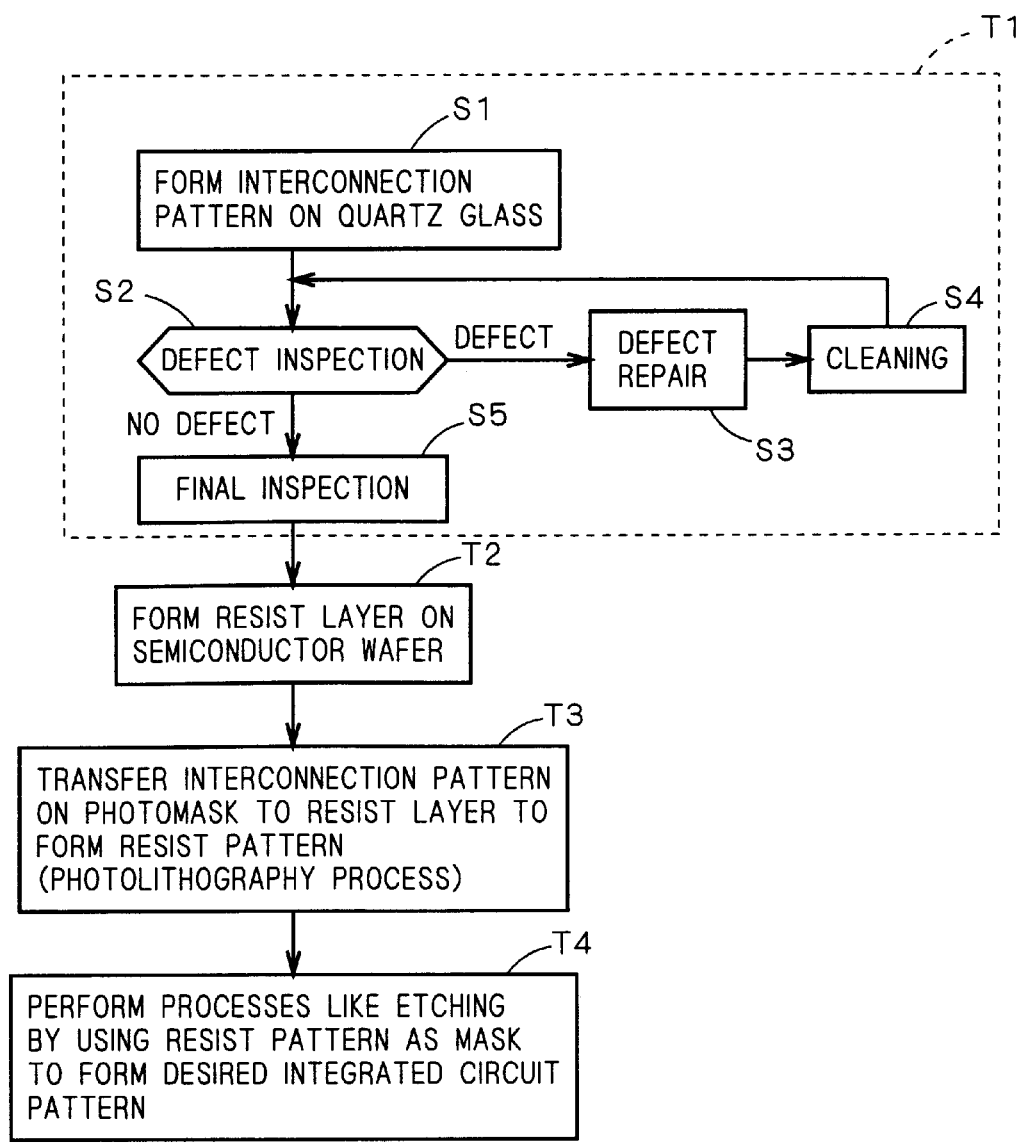
FIG. 12 is a flowchart showing a process for producing a semiconductor device integrated circuit pattern including a process of producing a photomask.

First, FIG. 12 is a flowchart schematically showing the process for forming an integrated circuit pattern on a given layer (an insulating layer or a metal film) on a semiconductor wafer or a semiconductor substrate by using a photomask produced by using the above-described opaque defect repair method. In the diagram, the process T1 corresponds to a photomask manufacturing process, which is the most important part in this preferred embodiment. This process T1 includes: (1) the step S1 of forming a CrON film (metal film) as an interconnection pattern on a surface of quartz glass as the base material of the photomask, (2) the step S2 of inspecting the photomask for opaque defects (opaque extension defects here) by using a common defect inspection device, (3) the opaque defect repairing step S3 of, when an opaque defect exists, applying a laser light to the beam irradiation region (the region 14 in FIG. 2, FIG. 6) by using the above-described opaque defect repair method, (4) the step S4 of cleaning the repaired photomask with a given cleaning solution, and (5) the step S5 of applying final inspection to the photomask when opaque defect is absent (for convenience, it is assumed here that no clear defect exists). The procedure of the opaque defect repair step S3, which is the most important among the steps, will be described in greater detail later.

Figure 13:
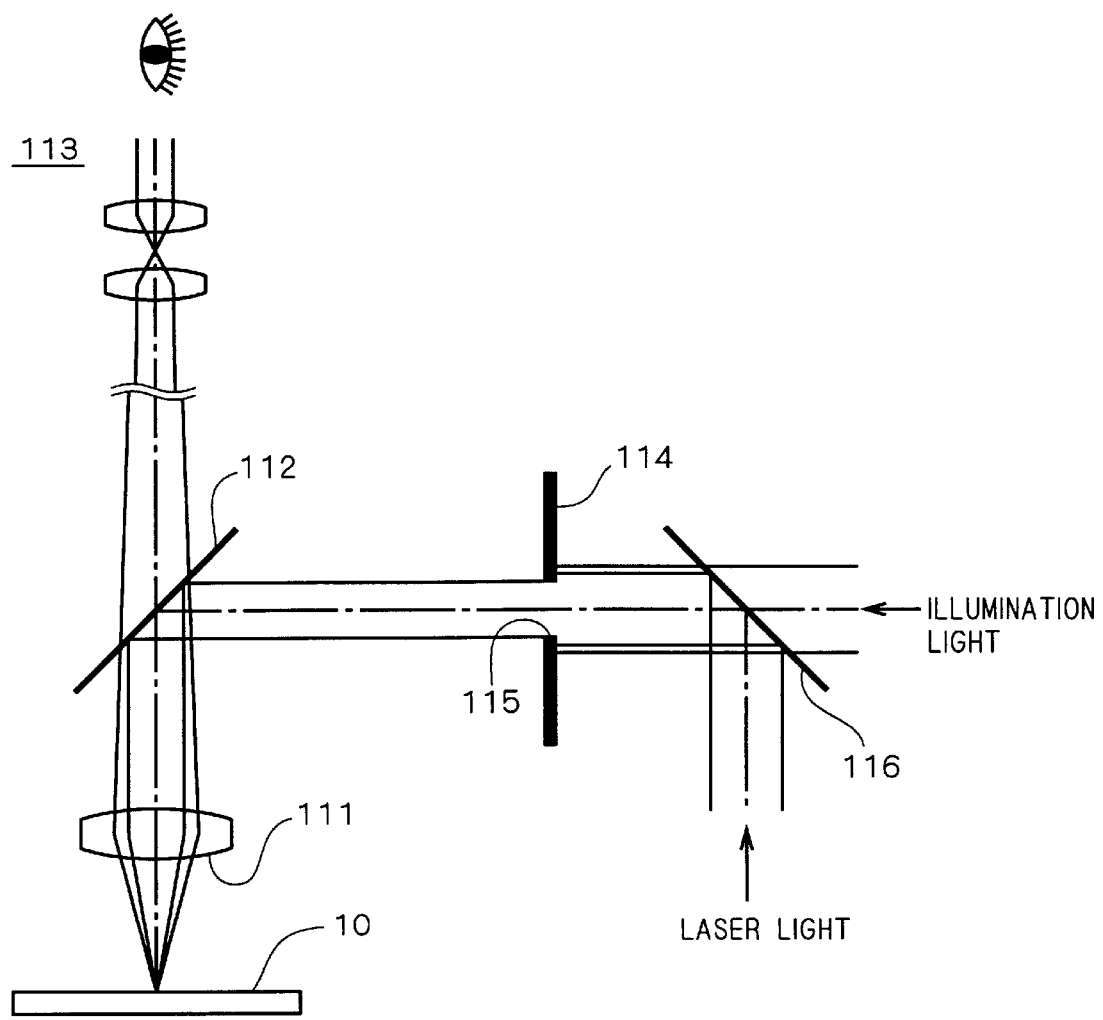
FIG. 13 is a diagram showing the structure of a laser repair device and its principle.

FIG. 13 is a diagram schematically showing the structure of a laser repair device 110 used in the step S3 and the operating principle of the device 110. In the diagram, the reference characters denote the following components; 10 is a photomask, 111 is an objective lens, 112 and 116 are half mirrors, 113 is a microscope, 114 is a slit, and 115 is an aperture. The photomask 10 is set on a movable stage (not shown). Now the step S3 of FIG. 12 will be described on the basis of the flowchart of FIG. 14 while referring to FIG. 13.

First, in the first step S31, the photomask 10 is set on the stage.

In the second step S32, defect inspection data (coordinate data) is called from the defect inspection device used in the step S2 in FIG. 12 and the data is entered into a data processing computer (not shown).

Next, in the third step S33, the data processing computer recognizes the positional coordinates of the opaque extension defect from the defect inspection data and controls the stage on the basis of the coordinates to move the photomask 10 to a position where the opaque extension defect can be seen through the microscope 113.

In the fourth step S34, the operator first puts on an illumination light source (not shown) to illuminate the surface of the photomask 10 with the illumination light through the half mirror 116, aperture 115, half mirror 112, and objective lens 111, and then checks the interconnection pattern on the surface of the photomask 10 and confirms the presence of the opaque extension defect continuous with one edge of the interconnection pattern by using the microscope 113. Then the operator moves to the process of shaping the slit 114 to adjust the aperture dimension of the aperture 115. In this step, the operator adjusts the aperture 115 of the slit 114 so as to illuminate the end of the opaque extension defect that is the most distant from the connection or boundary in the plus direction in the first direction D1 and it's vicinity with the illumination light. Then, from this position, the operator gradually changes the shape of the slit 114 to gradually enlarge the illuminated region toward the boundary. Alternatively, the operator gradually moves the stage to enlarge the illuminated region toward the boundary.

In the fifth step S35, turning off the illumination light source, or while keeping the light source on, the operator puts on a laser light source (not shown) to apply the laser light onto the surface of the photomask 10 to remove the irradiated area in the opaque extension defect portion. Subsequently, the operator puts off the laser light source. If the operator puts off the illumination light source when putting on the laser light source, the operator puts on the illumination light source again and if not, the operator keeps the illumination light source on. Then, the operator checks the defect repaired portion through the microscope 113 (the sixth step S36) and moves to the next evaluation process S37.

In the seventh step S37, the operator watches the repaired defect portion on the surface of the photomask 10 through the microscope 113 to make evaluation as to whether the position of part of the one edge of the interconnection pattern corresponding to the repaired defect portion is recessed from the connection in the first direction by a predetermined optimum quantity of bias offset of repairing $\Delta w_0$ ($\Delta w_0<0$), or as to whether it is recessed (when $\Delta w<0$) or protrudes ($\Delta w>0$) by the absolute value of a quantity of bias offset of repairing $\Delta w$ in a predetermined permissible range. In this step, a sample in which part of one edge of an interconnection pattern is recessed or protrudes by the optimum quantity of bias offset of repairing $\Delta w_0$ or the quantity of bias offset of repairing $\Delta w$ in the permissible range may be prepared so that the operator can determine whether the defect has been repaired satisfactorily by comparing the sample and the photomask under repair. Alternatively, the evaluation in this step can be achieved by once taking out the photomask under repair and measuring the quantity of recess or protrusion of the part of one edge of the interconnection pattern.

If the determination thus made is NO, the operator moves to the step S34 and repeats the steps S35 to S37 to apply the laser irradiation again. Thus the irradiation region is adjusted and enlarged toward the above-described beam irradiation region.

When a determination of YES is made in the step S37, the opaque extension defect repairing process ends and the photomask 10 is taken out (the eighth step S38).

After that, the operator moves to the process T2 shown in FIG. 12, where a resist layer is formed on the top surface of a semiconductor wafer or semiconductor substrate having a given layer on which a desired integrated circuit pattern is to be formed. Then the interconnection pattern on the photomask 10 produced in the process T1 is transferred onto the resist layer to form a resist pattern (the process T3). In this process, as stated above, the shortage of quantity of light due to reduction in transmittance in the repaired defect portion on the photomask 10 is offset and the resist dimension variation rate is suppressed to zero % or within a given permissible range (within ±10%, for example).

Finally, known processes such as etching etc. are performed by using the resist pattern as a mask to form integrated circuit patterns having desired dimensions (process T4).

First Modification of the First Preferred Embodiment

In the first preferred embodiment, the optimum quantity of bias offset of repairing $\Delta w_0$ and the permissible range of the quantity of bias offset of repairing $\Delta w$ have been described in examples in which a laser light beam is oscillated under the output conditions of an output of about 1 millijoules/pulse and a pulse width of about 0.6 nanoseconds. However, the optimum quantity of bias offset of repairing $\Delta w_0$ and the permissible range of the quantity of bias offset of repairing $\Delta w$ depend not only on the defect size (w1, w2) and the interconnection pattern intervals S but also on the laser light output conditions. Accordingly the optimum quantity of bias offset of repairing $\Delta w_0$ changes when the laser light output conditions change. For example, when a laser light having an output in the range of 4 millijoules/pulse to 6 millijoules/pulse and a pulse width of about 5 nanoseconds is used, the quartz glass portion corresponding to the repaired defect portion is damaged more severely and therefore the transmittance in that portion is reduced more largely. In this case, when the transmittance in the quartz glass portion free of opaque extension defects is taken as 100, the transmittance in the repaired defect portion is 81 in the case of a wavelength of 248 nm and it is 92 in the case of a wavelength of 365 nm, which are smaller than those under the laser light output conditions stated in the first preferred embodiment. Accordingly the sign of the optimum quantity of bias offset of repairing $\Delta w_0$ is negative and its absolute value is larger. We obtained actual measurements showing the following result. That is to say, when an opaque extension defect 13 (FIG. 1) connected to one edge in an interconnection pattern having the interconnection interval S of 1.5 $\mu$m or smaller is repaired with a laser light under the above-stated output conditions, the optimum quantity of bias offset of repairing $\Delta w_0$ must be set to $-0.15$ $\mu$m or below so that one edge of the interconnection pattern is recessed after repair from the original position of one edge of the interconnection pattern by a larger distance than that in the laser light repair in the first preferred embodiment. Table 2 shows the actual measurements of the optimum quantity of bias offset of repairing $\Delta w_0$ with respect to the interconnection pattern interval S in the case where an opaque extension defect is repaired by using a laser light having those output conditions. Note that Table 2 shows data about opaque extension defects or bridge defects having varying sizes, where the width w1 is equal to or smaller than the interval S and the width w2 is in the range of about 0.5 $\mu$m to 3 $\mu$m, for example.

TABLE 2

| Interval S of photomask interconnection pattern | below 1 $\mu$m | 1 $\mu$m to 1.5 $\mu$m excl. | 1.5 $\mu$m to 5 $\mu$m excl. | 5 $\mu$m or above |
|---|---|---|---|---|
| Optimum quantity of bias offset of repairing $\Delta w_0$ | $-0.3$ $\mu$m or below | $-0.3$ $\mu$m to $-0.15$ $\mu$m | $-0.15$ $\mu$m to $-0.05$ $\mu$m | $-0.05$ $\mu$m to 0 $\mu$m |

As shown in Table 2, as in the case of the repair using a laser light under the output conditions mentioned in the first preferred embodiment (see Table 1), as the interconnection pattern interval S becomes larger, the sign of the optimum quantity of bias offset of repairing $\Delta w_0$ changes from minus to plus and its absolute value becomes smaller also when a laser light oscillated under the above-mentioned output conditions is used.

Thus, also under these output conditions of the laser light, it is possible to minimize the dimensional variation of resist pattern transferred on a semiconductor wafer caused by the transmittance reduction in the repaired defect portion of the photomask, or the dimensional variation of the integrated circuit pattern finally produced on the basis of the resist pattern, by repairing a defect in such a manner that the position of one edge of the interconnection pattern is recessed ($\Delta w_0<0$) from the original position in the minus direction in the first direction by the optimum quantity of bias offset of repairing $\Delta w_0$ in the range shown in Table 2 which is determined mainly in accordance with the interconnection pattern S. Further, it is also possible under these output conditions to suppress the dimensional variation rate of the resist pattern within a permissible range of the semiconductor device (e.g. within ±10%) as described above by repairing a defect portion with a laser light with a quantity of bias offset of repairing $\Delta w$ within the permissible range including the optimum quantity of bias offset of repairing $\Delta w_0$ shown in Table 2.

Second Modification of the First Preferred Embodiment

While the first preferred embodiment and its first modification have described a method for repairing opaque extension defects, the repair method and the repair principle can be similarly applied to repair of isolated opaque defects formed in close proximity to the interconnection pattern.

Figure 15:
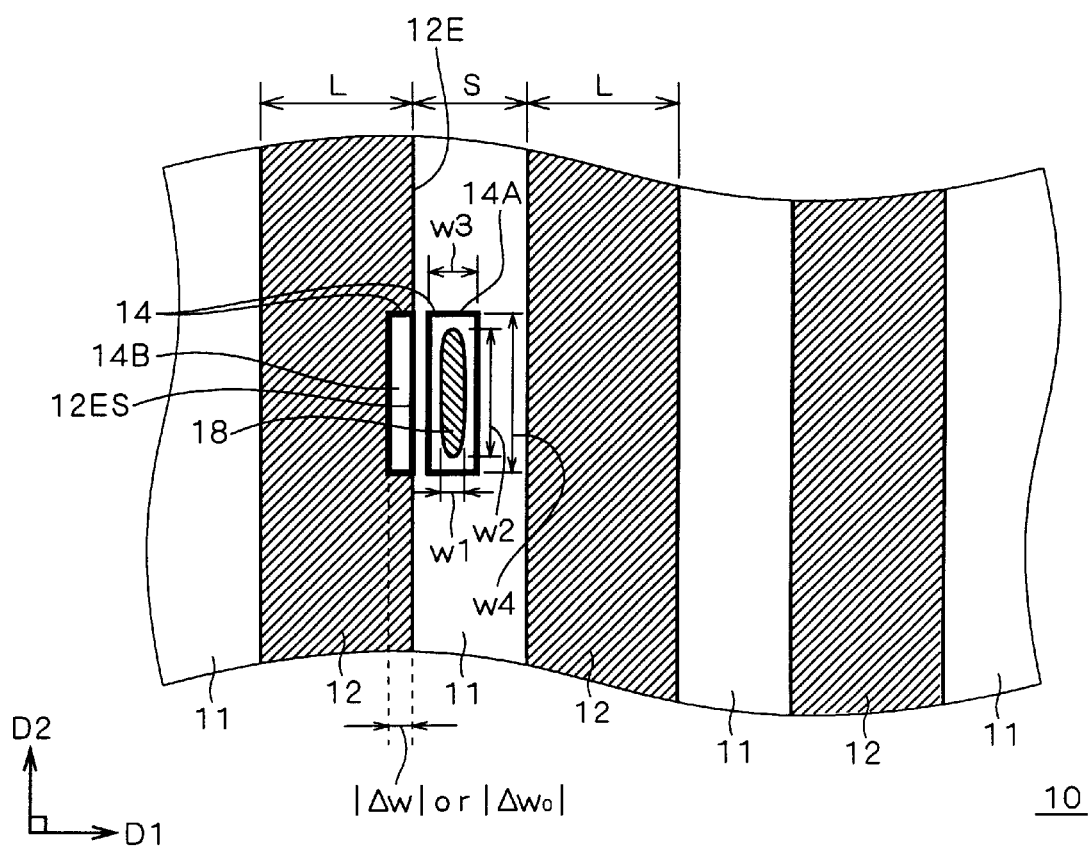
FIG. 15 is a plane view of a photomask showing an example of a beam irradiation region for repairing an isolated opaque defect existing in close proximity to an interconnection pattern edge.

The plane view of the photomask 10 of FIG. 15 shows a beam irradiation region 14 set to repair an isolated opaque defect 18 (having a first width w1 and a second width w2) with laser light. This diagram shows an example in which the quantity of bias offset of repairing $\Delta w$ or the optimum quantity of bias offset of repairing $\Delta w_0$ is negative. As shown in FIG. 15, the region 14 includes: (1) a rectangular irradiation region 14A having a third width w3 and a fourth width w4 (the third width w3 may be equal to the first width w1 and the fourth width w4 may be equal to the second width w2) and containing the isolated opaque defect 18 and (2) a pattern repaired region 14B having the fourth width w4 in the second direction D2 and extending into the interconnection pattern 12 from the part 12ES facing to the defect 18 in one edge 12E of the interconnection pattern 12 proximate to the defect 18, where the pattern repaired region 14B extends by the absolute value of the quantity of bias offset of repairing $\Delta w$ or the optimum quantity of bias offset of repairing $\Delta w_0$ in the minus direction in the first direction D1. The beam irradiation region 14 set in this way is irradiated with laser light. Thus, part of one edge 12E of the interconnection pattern 12 facing the quartz glass portion on which the isolated opaque defect 18 is repaired and removed is recessed in the minus direction in the first direction D1 from the position of the part 12ES by the absolute value of the quantity of bias offset of repairing $\Delta w$ or the optimum quantity of bias offset of repairing $\Delta w_0$.

When $\Delta w > 0$, the beam irradiation region is set by narrowing the region 14A in the plus direction in the first direction D1 by the quantity of bias offset of repairing $\Delta w$.

Third Modification of the First Preferred Embodiment

Figure 16:
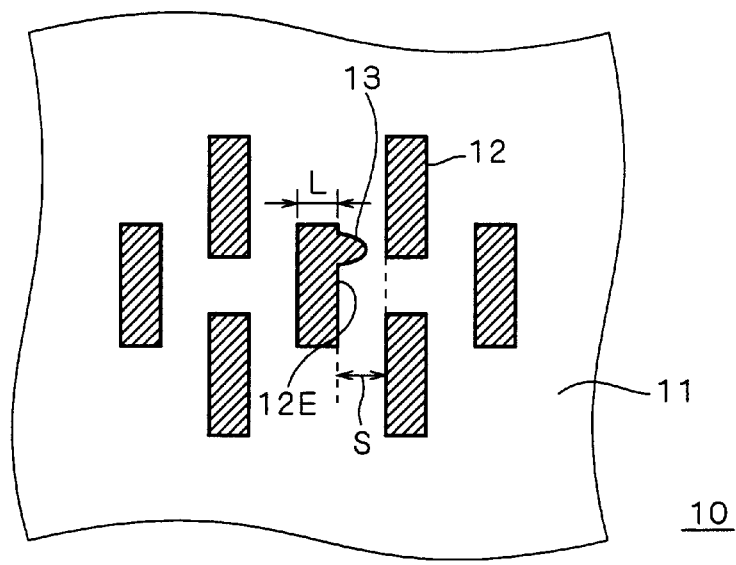
FIGS. 16 and 17 are plane views of photomasks each showing an opaque extension defect connected to an edge of an interconnection pattern which is not perfectly linear.
Figure 17:
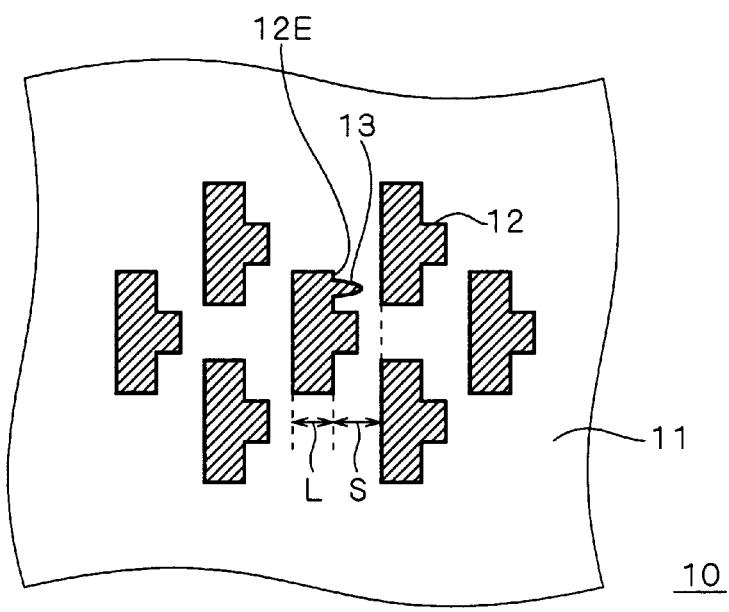

The first preferred embodiment and its first and second modifications have shown a method for repairing opaque defects connected to a perfectly linear interconnection pattern and the structures of the metal film interconnection pattern which are optimum to minimize the dimensional variation rate of resist pattern formed by transferring the pattern to a semiconductor wafer or to restrain it within a permissible range required for the semiconductor device. However, the metal film interconnection pattern on the photomask does not necessarily have to be perfectly linear. If the interconnection pattern has an equivalent quartz glass portion extending by a dimension corresponding to the interconnection pattern interval S along the first direction, the pattern can be repaired into a pattern structure in which part of its pattern edge is missing by the absolute value of the optimum quantity of bias offset of repairing $\Delta w_0$ shown in Tables 1 and 2, or into a pattern structure in which part of the pattern edge is missing or protrudes by the absolute value of the quantity of bias offset of repairing $\Delta w$ within the permissible range for restricting the dimensional variation rate of the resist pattern within ±10%, for example. It is thus possible to suppress the dimensional variation rate of the resist pattern on the semiconductor wafer to zero % or within a given range permissible for the device. FIGS. 16 and 17 show examples of such interconnection pattern on a photomask.

Second Preferred Embodiment

This preferred embodiment shows a method for repairing opaque extension defects on a halftone phase shift photomask that has a metal film pattern of MoSiON (oxynitride of molybdenum silicide) having a film thickness of about 0.1 $\mu$m and transmitting ultraviolet light. The halftone phase shift photomask is a photomask which provides higher resolution on the resist pattern transferred onto a semiconductor wafer in the photomechanical process by varying the phase of the light transmitted through the MoSiON metal film. That is to say, in the halftone phase shift photomask, the phase of the light transmitted through the metal film pattern is inverted by 180 degrees with respect to the phase of the light transmitted through the quartz glass portion. Accordingly, when the halftone phase shift photomask is used, the light intensity in the edge portion in the metal film pattern can be reduced and the pattern edge portion can be transferred to the resist on the semiconductor wafer in a more enhanced manner, so that the pattern resolution can be increased. This effect is remarkably produced especially when the configuration of the MoSiON metal film pattern has rectangular openings, i.e. a hole pattern. Also when repairing and removing opaque defects on a halftone phase shift photomask having such characteristics with irradiation of laser light, the transmittance in the repaired defect portion is reduced and it is difficult to sufficiently control the phase of the light transmitted through the repaired defect portion as in the defect free portions. For example, when repairing an opaque defect with a laser light oscillated under the output conditions mentioned in the first preferred embodiment, if the transmittance in the defect-free portion is taken as 100, the transmittance in the repaired defect portion is 96.6 with a wavelength of 248 nm. When repairing a defect with a laser light under the output conditions shown in the first modification of the first preferred embodiment, the transmittance is 86.5 with a wavelength of 248 nm. Thus, the intensity of the light transmitted through a pattern edge portion in the repaired defect portion differs from that of the light transmitted through defect-free pattern edge portions, which raises the problem that the pattern resolution cannot be enhanced as desired.

Accordingly, the application of the repair method described in the first preferred embodiment is required also when repairing opaque defects on the halftone phase shift photomask, such as opaque extension defects and isolated opaque defects in close proximity to pattern edges. Now, considering this point, a method for manufacturing a phase shift photomask in which part of the metal film pattern is opened to form a hole pattern in the quartz glass portion will be described, where an opaque extension defect continuous with one edge of the metal film pattern forming the hole pattern can be repaired to control the dimensional variation rate of the resist pattern to zero % or within a permissible range after transfer.

Figure 18:
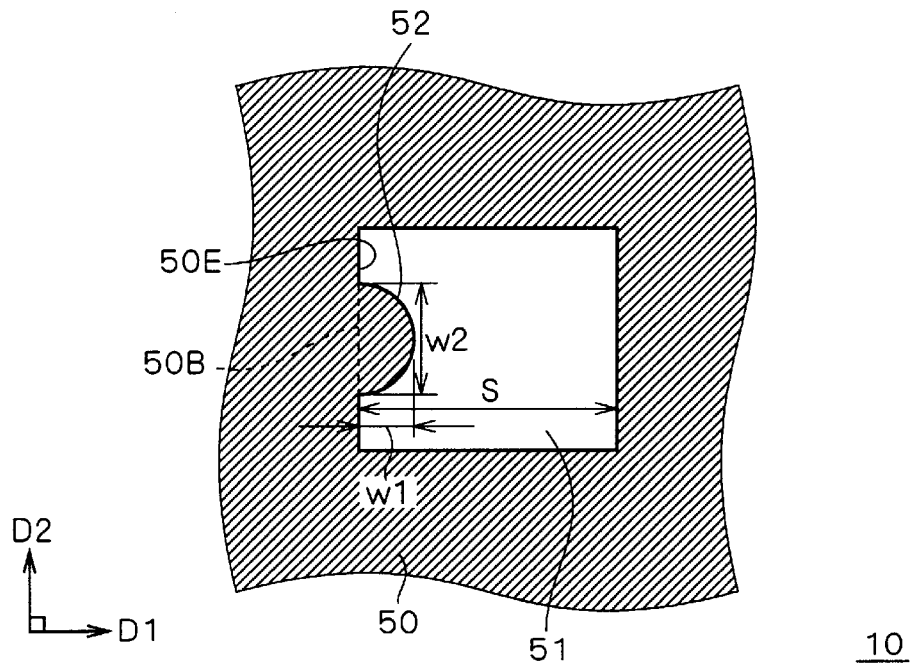
FIG. 18 is a plane view showing a opaque extension defect continuous with an edge of a metal film pattern on an MoSiON halftone phase shift photomask in a second preferred embodiment of the invention.

FIG. 18 is a plane view showing an opaque extension defect 52 in a metal film pattern 50 on a halftone phase shift photomask 10, where the opaque extension defect 52 is continuous with part (a boundary or connection) of one edge 50E among the four edges of (inside) the hole and has first and second widths w1 and w2 in the first and second directions D1 and D2, respectively. In the diagram, the character S shows the width (hole size) in the first direction D1 of the hole surrounded by the internal edges of the metal film pattern 50, which corresponds to the dimension in the first direction D1 of the quartz glass portion (also referred to as hole pattern) 51 in the hole that contains the opaque extension defect 52.

Figure 19:
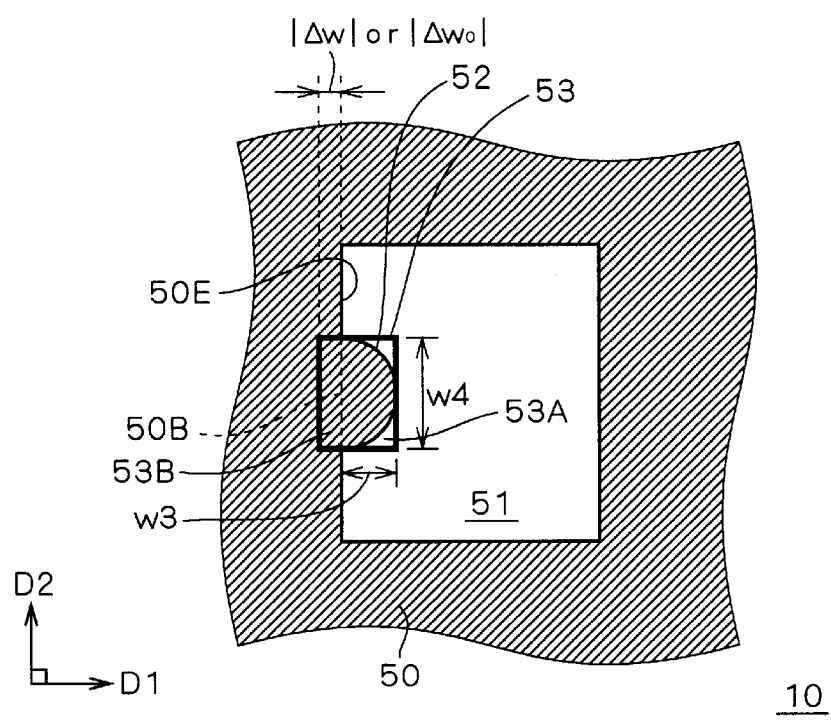
FIG. 19 is a plane view of the phase shift photomask showing a beam irradiation region in the second preferred embodiment.

Next, FIG. 19 is a plane view showing a beam irradiation region 53 for removing the opaque extension defect 52 on the phase shift photomask 10. Also in this case, the region 53 includes: (1) an irradiation region 53A containing the opaque extension defect 52 and having a third width w3 (=w1) and a fourth width w4 (=w2) respectively in the first and second directions D1 and D2, and (2) a pattern repaired region 53B having the width w4 in the second direction D2 and extending from the boundary 50B in the minus direction in the first direction D1 by the absolute value of a quantity of bias offset of repairing $\Delta w$ in the above-described permissible range or of the optimum quantity of bias offset of repairing $\Delta w_0$. Note that the sign of the quantity of bias offset of repairing $\Delta w$ can be set to plus depending on the value of the hole size S, output conditions of the laser light, and the size of the opaque extension defect (including bridge defect). In such a case, the beam irradiation region is set by narrowing the irradiation region 53A shown in FIG. 19, or shown by (1), by the absolute value of the quantity of bias offset of repairing $\Delta w$ in the plus direction in the first direction D1 as shown in FIG. 6.

Figure 20:
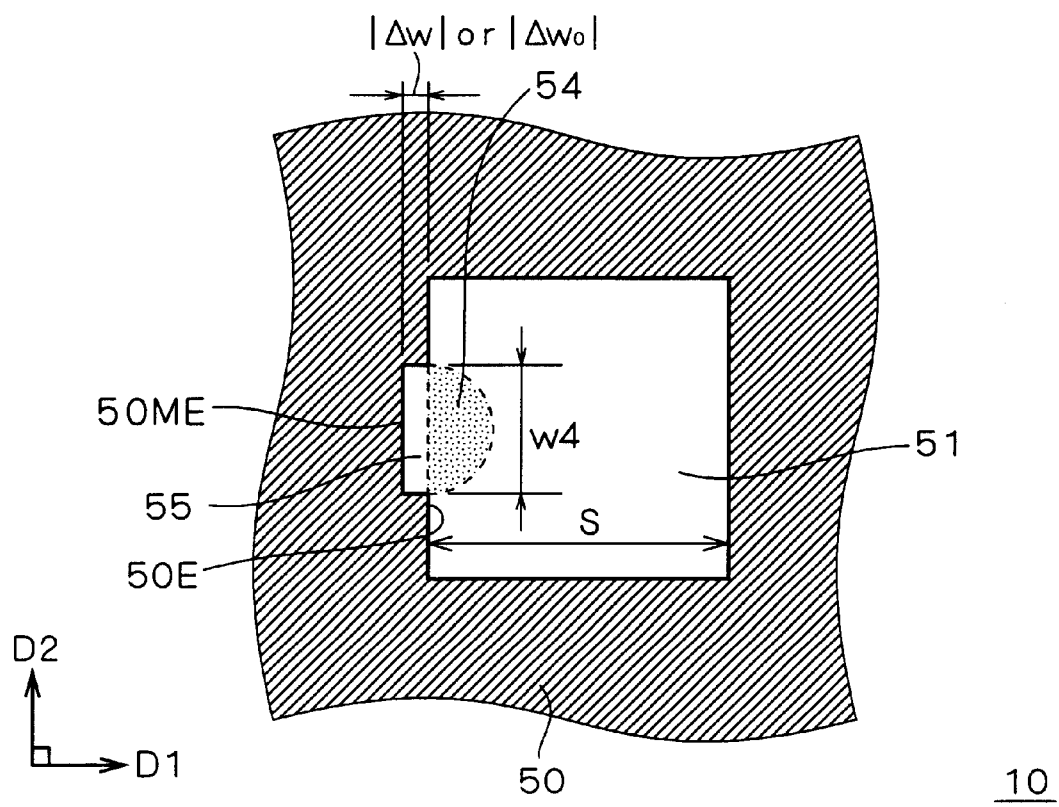
FIG. 20 is a plane view showing the phase shift photomask obtained after the opaque extension defect has been removed by irradiating the beam irradiation region of FIG. 19 with a laser light.
Figure 21A:
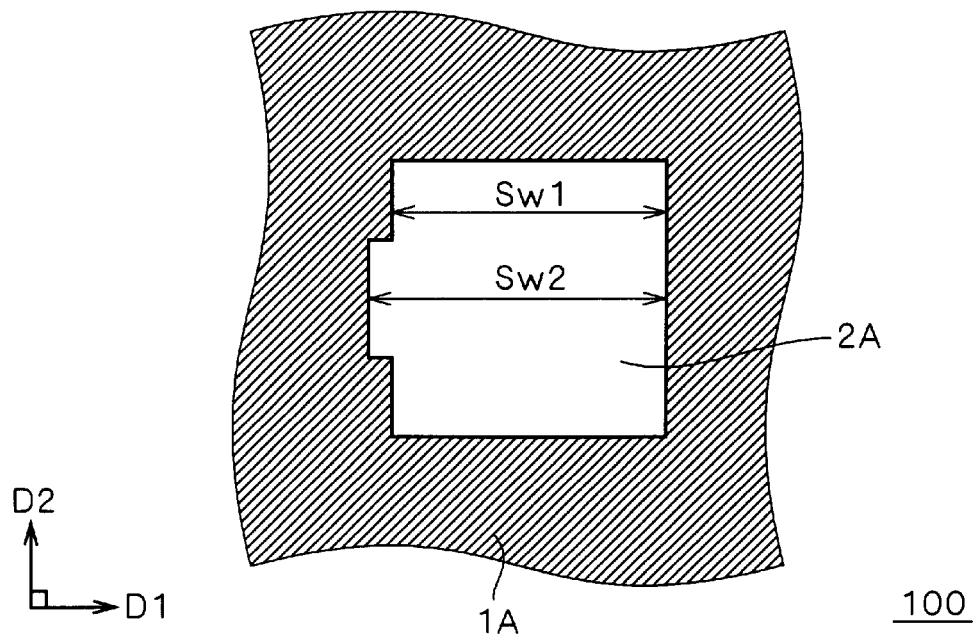
FIGS. 21A and 21B are plane views each showing a semiconductor device having a resist pattern formed by transferring the hole pattern on the photomask in FIG. 20 onto a resist layer.
Figure 21B:
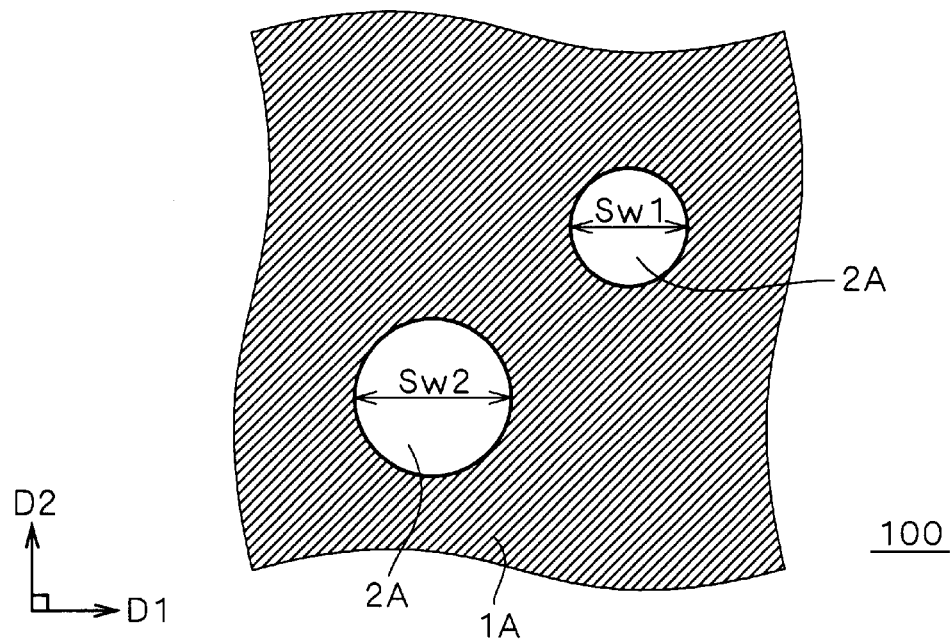

Next, FIG. 20 is a plane view showing the metal film pattern 50 on the phase shift photomask 10 obtained after the opaque extension defect 52 has been completely removed by applying a laser light onto the beam irradiation region 53 shown in FIG. 19. Also in FIG. 20, the portion 50ME corresponding to the repaired defect portion 54 in the inner edge 50E of the metal film pattern 50 is recessed in the minus direction in the first direction D1 by the absolute value of the quantity of bias offset of repairing $\Delta w$ or the optimum quantity of bias offset of repairing $\Delta w_0$. Thus a missing portion or a recessed portion 55 is formed in part of the pattern edge 50E and the quartz glass portion under it is exposed. FIGS. 21A and 21B show resist pattern 1A formed by transferring such a metal film pattern 50 or hole pattern 51 to a resist layer on a semiconductor wafer by using such a phase shift photomask 10. In FIGS. 21A and 21B, the character 2A shows the semiconductor substrate surface or hole pattern. While FIG. 21A shows the hole pattern 2A in a rectangular form, the hole pattern 2A on the semiconductor wafer is formed in a round or circular shape as shown in FIG. 21B when the hole size S of the hole pattern 51 on the photomask is about 10 $\mu$m or smaller. Note that the hole pattern 2A having the hole size Sw1 in FIG. 21B is formed when there is no opaque defect and the hole pattern 2A with the hole size Sw2 is formed after an opaque defect has been repaired by this repair method.

When the edge 50ME shown in FIG. 20 is recessed after the repair from the original position by the absolute value of the optimum quantity of bias offset of repairing $\Delta w_0$, the dimensional variation rate (Sw2−Sw1)×100/Sw1 of the resist pattern 1A of FIGS. 21A and 21B is 0%. When the edge 50ME is recessed by the absolute value of an appropriate quantity of bias offset of repairing $\Delta w$ within the permissible range, the dimensional variation rate of the resist pattern 1A is within a range permitted for the semiconductor device 100 (e.g. within ±10%).

Figure 22:
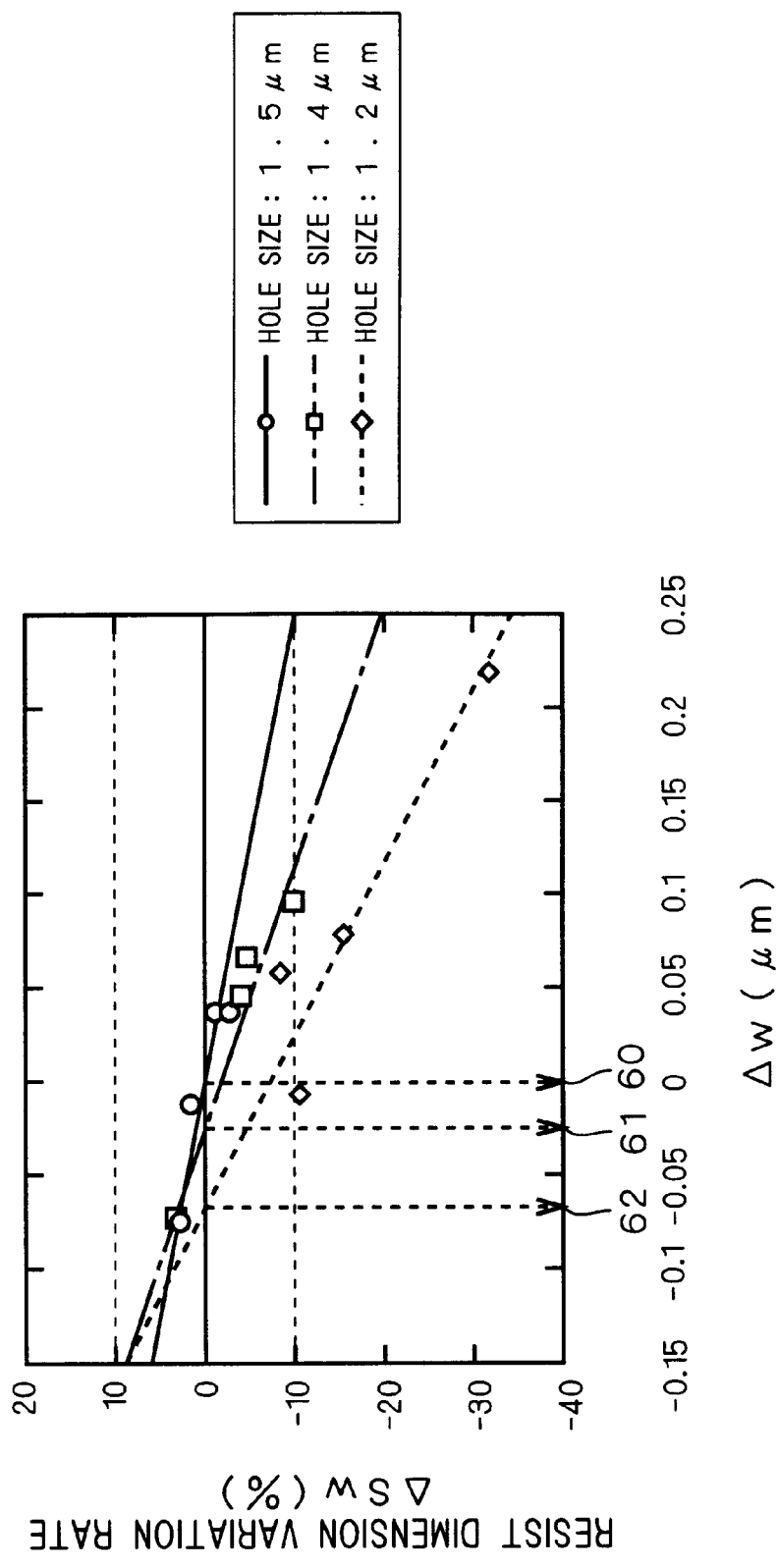
FIG. 22 is a diagram showing the quantity of bias offset of repairing and the dimensional variation rate of a resist pattern formed by transferring a repaired hole pattern onto a semiconductor wafer, which was obtained in examples where, in metal film patterns respectively having hole sizes of 1.2 μm, 1.4 μm, and 1.5 μm and formed on the MoSiON halftone phase shift photomask shown in the second preferred embodiment of the invention, opaque extension defects having a width of about 0.5 μm in both the first and second directions and continuous with one edge of the metal film pattern were repaired with a laser light.

FIG. 22 shows the summary of the actual measurements of the quantity of bias offset of repairing $\Delta w$ for repairing the opaque extension defect 52 in the hole pattern 51 with a laser light under the same output conditions as those described in the first preferred embodiment and the quantity of dimensional variation $\Delta Sw$ of the resist pattern formed by transferring the repaired metal film pattern 50 on the phase shift photomask 10 onto a semiconductor wafer. From this diagram, when the hole pattern 51 has a width S of 1.5 $\mu$m, the optimum quantity of bias offset of repairing 60 is almost 0 $\mu$m, and the beam irradiation region is the same as the conventional irradiation region. However, when the hole pattern 51 has a width S of 1.4 $\mu$m, the optimum quantity of bias offset of repairing 61 is about −0.03 $\mu$m. When the width S of the hole pattern is further reduced to 1.2 $\mu$m, the optimum quantity of bias offset of repairing 62 is about −0.07 $\mu$m. In this way, as the hole size S becomes smaller, the pattern edge must be recessed by repair by a larger quantity in the minus direction in the first direction D1 from the original pattern edge.

As is clear from FIG. 22, as the hole size S becomes smaller, the dimension of the resist pattern on the semiconductor wafer varies more largely as the quantity of bias offset of repairing $\Delta w$ varies, and then the quantity of bias offset of repairing $\Delta w$ is allowed to vary in a smaller range (the required repair accuracy becomes more severe) to suppress the dimensional variation rate $\Delta Sw$ of the resist pattern within ±10%.

Table 3 shows the relation between the optimum quantity of bias offset of repairing $\Delta w_0$ and the hole size or hole blank dimension S, where an opaque extension defect is repaired on a halftone phase shift photomask using a MoSiON film as the metal film pattern. Note that the width dimensions of the convex defects are not uniform and the width w1 is equal to or smaller than the hole size S and the width w2 is also equal to or smaller than the hole size S.

TABLE 3

| Hole pattern blank dimension S on phase shift photomask | below 1 $\mu$m | 1 $\mu$m to 1.5 $\mu$m excl. | 1.5 $\mu$m or above |
|---|---|---|---|
| Optimum quantity of bias offset of repairing $\Delta w_0$ | −0.1 $\mu$m or below | −0.1 $\mu$m to 0 $\mu$m | −0.05 $\mu$m to 0 $\mu$m |

In this way, when repairing the opaque extension defect 52 (FIG. 18) having a defect size (w1) of 0.5 $\mu$m, for example, with a laser light under the above-mentioned output conditions, it is possible to suppress the dimensional variation rate of a resist pattern transferred onto a semiconductor wafer caused by the reduction in transmittance in the repaired portion on a phase shift photomask to almost zero % by correcting the conventional irradiation region on the basis of the optimum quantity of bias offset of repairing $\Delta w_0$ within the range shown in Table 3 which is determined in accordance with the hole pattern size S. It is also possible to suppress the dimensional variation rate of the resist pattern within the permissible range required in respect of quality of the device by correcting the conventional irradiation region on the basis of a quantity of bias offset of repairing $\Delta w$ within the permissible range determined for each optimum quantity of bias offset of repairing $\Delta w_0$ in Table 3.

The same laser repair device as that shown in FIG. 13 can be used in the laser light repair described here.

Third Preferred Embodiment

The first preferred embodiment, its first to third modifications, and the second preferred embodiment have shown a method for suppressing the dimensional variation rate of the resist pattern transferred on a semiconductor wafer within a range required for the device quality, where an opaque extension defect (including a bridge defect) connecting with the metal film pattern on the photomask is removed by irradiation of a laser light and the original pattern edge is recessed in the first direction by the optimum quantity of bias offset of repairing $\Delta w_0$ or a quantity of bias offset of repairing $\Delta w$ within a permissible range or the pattern edge is made to protrude in the first direction by a quantity of bias offset of repairing $\Delta w$ within the permissible range, so as to compensate for the variation in transmittance in the repaired defect portion. This preferred embodiment uses the same repair principle, but it uses an ion beam for repair in place of a laser light beam. That is to say, this preferred embodiment shows an example in which an opaque extension defect continuous with one edge of a metal film pattern is repaired and removed by using an ion beam. Needless to say, the method shown in this preferred embodiment is applicable also to repair of isolated opaque defects proximate to a pattern on a photomask.

The opaque extension defect repair method with ion beam etching is achieved as follows on the whole. That is to say, when removing an opaque extension defect with an ion beam, the metal film in the opaque extension defect portion is sputter-etched by ion particles of gallium etc. accelerated by high voltage and is removed from the surface. In this process, the secondary electrons of Si etc. emitted from the surface of quartz glass during the ion sputtering are detected to detect when the metal film in the opaque extension defect portion is completely etched and the underlying quartz glass portion appears in the surface, and the repair work is stopped at this point of time. In this process, when the underlying quartz glass surface is sputtered by the ion beam immediately before the metal film in the opaque extension defect portion is completely etched and immediately after the metal film in the opaque extension defect is completely etched, the quartz glass portion underlying the opaque extension defect metal film may be damaged and small irregularities may be formed on the surface. Further, the ions may be injected into the sputtered quartz glass portion. Then, as in the case of the repair with a laser light, the transmittance in the quartz glass portion exposed after repair of the opaque extension defect becomes smaller than that in the defect-free quartz glass portions. Accordingly, also when repairing an opaque extension defect with ion beam etching, the same process as that described in the first embodiment is required in order to compensate for the transmittance reduction. Then, the pattern edge after being repaired is recessed from the original pattern edge in the minus direction in the first direction by the optimum quantity of bias offset of repairing $\Delta w_0$ which is determined in accordance with the ion beam output conditions, the pattern intervals in the first direction, and the defect size, or by the quantity of bias offset of repairing $\Delta w$ in the permissible range required for the device quality; or the pattern edge is made to protrude in the plus direction by the quantity of bias offset of repairing $\Delta w$ (note that it may be set in the conventional way ($\Delta w=0$) depending on the conditions). Then the dimensional variation of the resist pattern formed by transferring the metal film pattern to a semiconductor wafer can be restrained to almost zero value or within a range required for the device quality.

Figure 23:
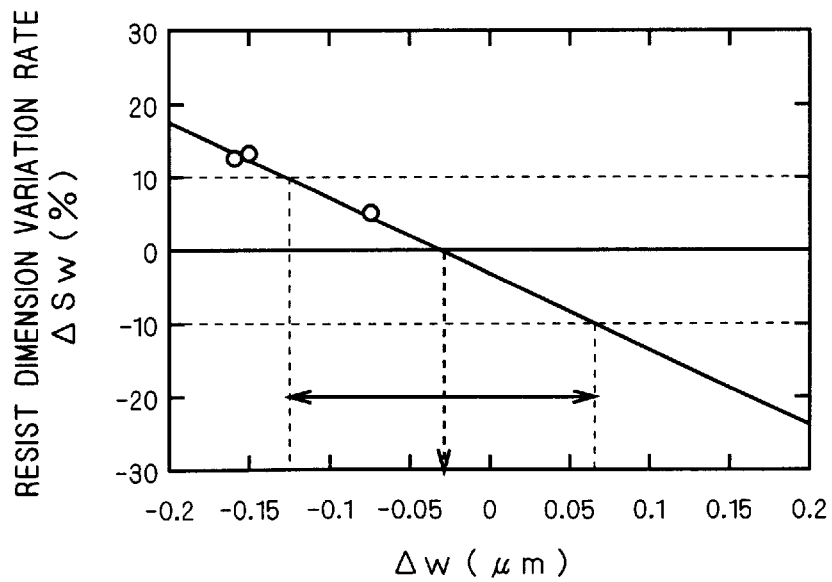
FIG. 23 is a diagram showing the relation between the quantity of bias offset of repairing and the resist dimension variation rate in the case of ion beam etching in a third preferred embodiment.

FIG. 23 is a diagram showing the relation between the quantity of bias offset of repairing $\Delta w$ and the resist dimension variation rate $\Delta Sw$ for each quantity of bias offset of repairing $\Delta w$, where in a linear interconnection pattern having the interconnection width L and the interconnection interval S (see FIG. 1) both equal to 1.0 $\mu$m, a bridge defect (w1=w2=1.0 $\mu$m) connected to edges of two adjacent lines of the interconnection pattern is repaired and removed by gas-assisted ion beam etching. In the diagram, blank circles show actual measurements. In this case, an ion beam was outputted under conditions of a voltage of 20 keV, a current of 50 pA, and a beam diameter of 0.15 $\mu$m. From the diagram, with the output conditions, and with the defect size and pattern interval S mentioned above, the optimum quantity of bias offset of repairing $\Delta w_0$ is about −0.03 $\mu$m and the permissible rage of the quantity of bias offset of repairing $\Delta w$ required to suppress the resist pattern dimension variation rate $\Delta Sw$ within +10% is in the range of about −0.125 $\mu$m to +0.06 $\mu$m.

Table 4 shows actual measurements of the optimum quantity of bias offset of repairing $\Delta w_0$ for various intervals S in the case of repairing an opaque extension defect (see FIG. 1) by ion beam etching on a common photomask using a CrON film as a metal film linear interconnection pattern. The ion beam was outputted under the same conditions as those in FIG. 23 in this case, but the opaque extension defect size was not uniform and the width w1 was within the interval S and the width w2 was in the range of about 0.5 $\mu$m to 3 $\mu$m.

TABLE 4

| Interconnection pattern interval S on photomask | below 1 $\mu$m | 1 $\mu$m to 1.5 $\mu$m excl. | 1.5 $\mu$m or above |
|---|---|---|---|
| Optimum quantity of bias offset of repairing $\Delta w_0$ | −0.05 $\mu$m or below | −0.1 $\mu$m to 0 $\mu$m | −0.05 $\mu$m to 0 $\mu$m |

Also in this preferred embodiment, the permissible range of the quantity of bias offset of repairing $\Delta w$ can be obtained so that the resist pattern dimension variation rate can be at permissible value required for the device quality (for example, within ±10%) for each optimum quantity of bias offset of repairing $\Delta w_0$ in Table 4.

Next, an ion beam etching device and the procedure of the defect repair method by ion beam etching using the device will be described referring to FIGS. 24 and 25.

Figure 24:
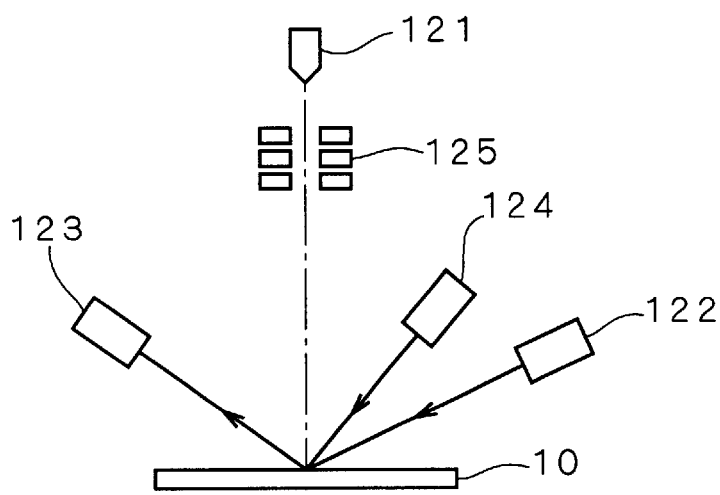
FIG. 24 is a diagram showing the structure of an ion beam etching device and its principle.

In FIG. 24, the ion beam etching device 120 has an ion gun 121 for outputting an ion beam while scanning, a slit 125 for limiting the width of the ion beam, an electron gun 122 for supplying an electron beam for neutralizing charging up of plus charge on the surface of the photomask 10 when the ion beam is sputtered onto the surface, a secondary ion detector 123 for detecting secondary electrons of metal such as Cr and Si emitted from the surface of the photomask 10 during the ion beam sputtering and generating and outputting image data of the sputtered surface to a data processing computer (not shown), a gas injector 124 and a stage not shown.

Figure 14:
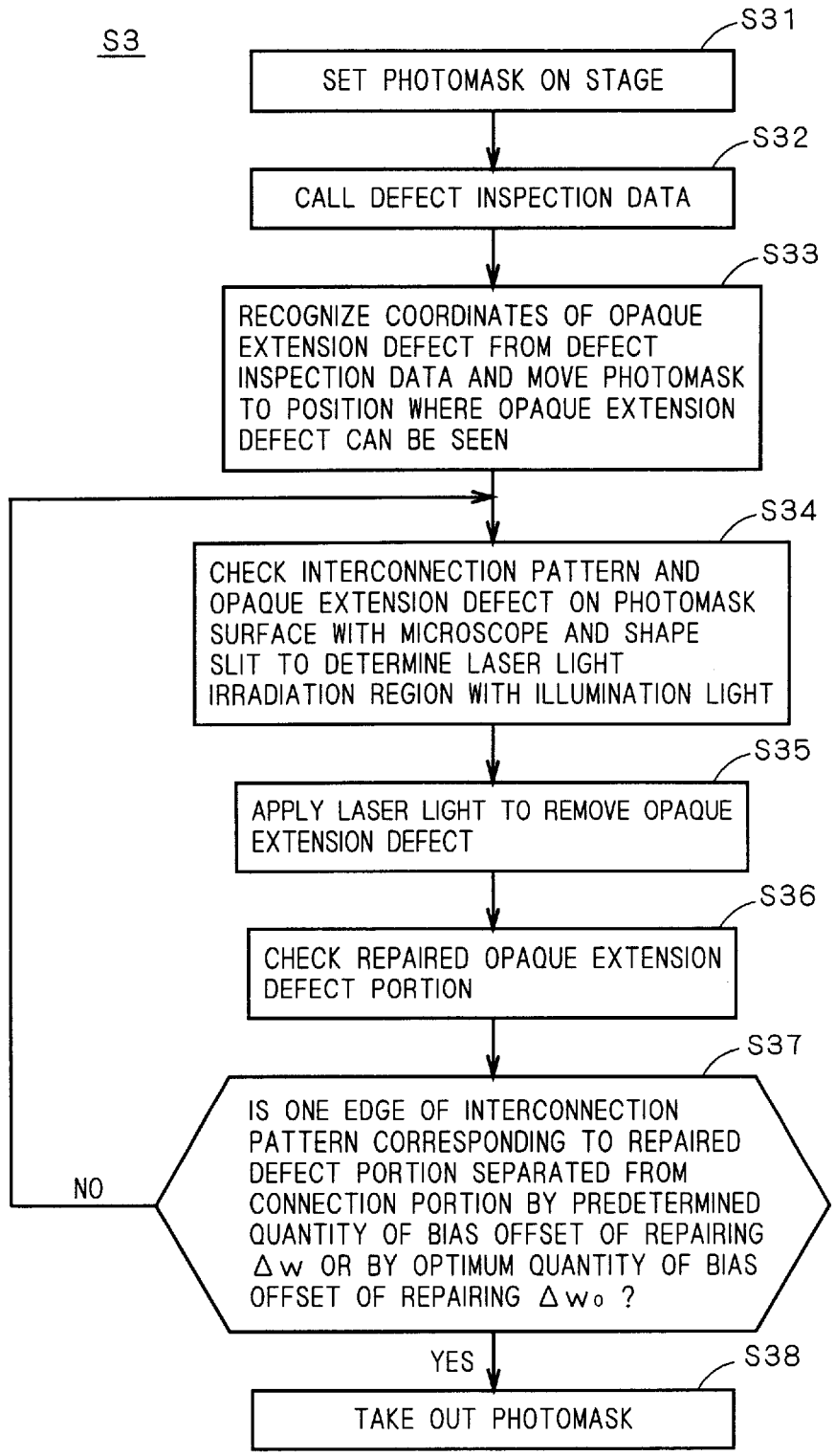
FIG. 14 is a flowchart showing the procedure for repairing an opaque extension defect with a laser light.
Figure 25:
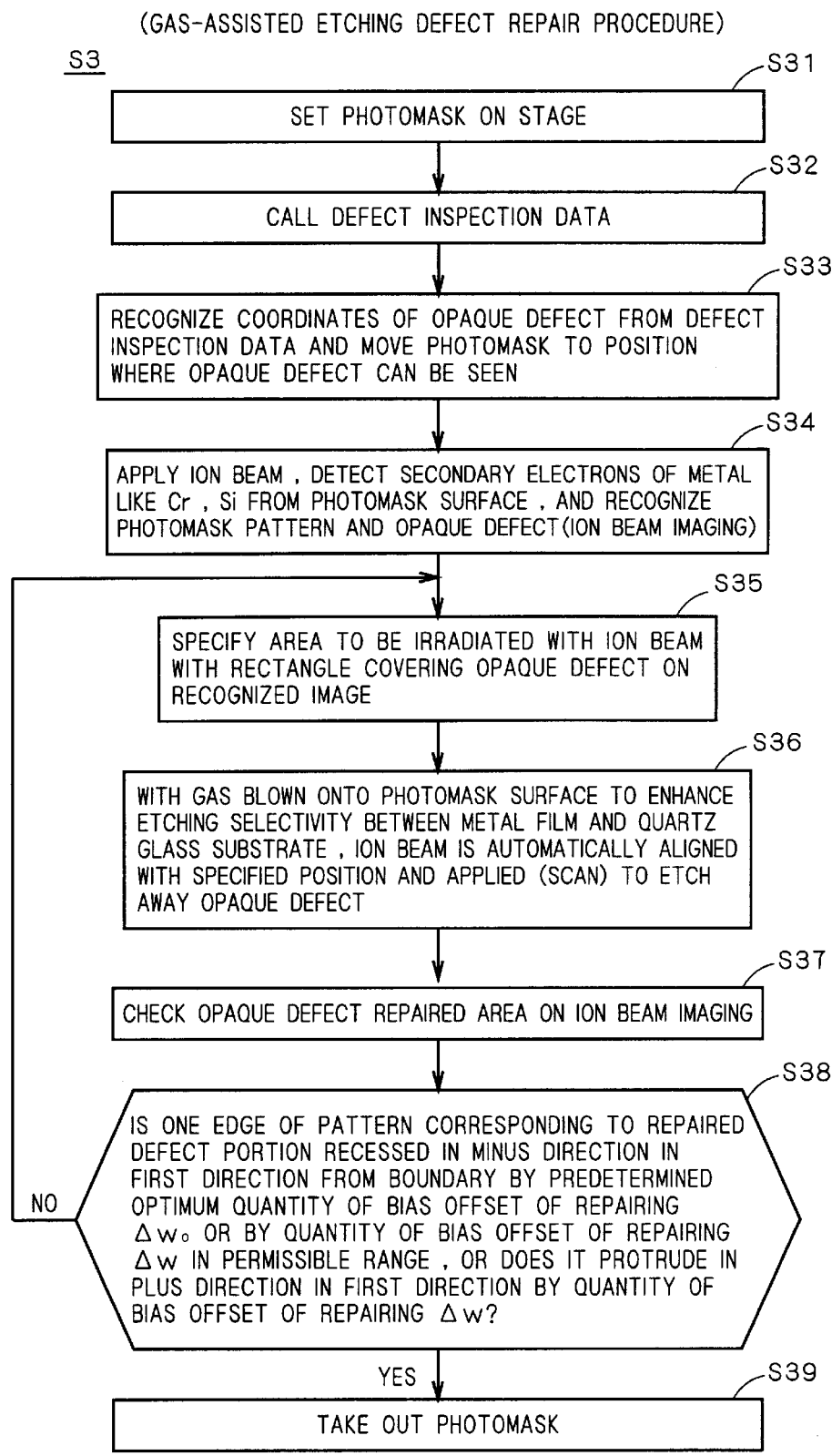
FIG. 25 is a flowchart showing a procedure of repairing an opaque extension defect by ion beam etching.

FIG. 25 is a flowchart showing the details of the step S3 shown in FIG. 12 described before, where the steps S31 to S33, S38 and S39 in FIG. 25 correspond to the steps S31 to S33, S38 and S39 in FIG. 14, respectively.

In the step S34 in FIG. 25, first, an ion beam is emitted from the ion gun 121 and secondary electrons emitted from the surface of the photomask 10 are detected in the secondary ion detector 123. Then the data processing computer generates an image of the metal film pattern and an opaque defect on the photomask 10 on the basis of the detected data (ion beam imaging). Next, in the step S35, from the image on the screen, the operator sets a rectangular ion beam irradiation region partially or entirely covering the opaque defect image from the end of the opaque defect toward the boundary. On the basis of the setting, the computer controls the ion gun 121 (control of ion beam scanning) and the gas injector 124 so that the ion beam outputted from the ion gun 121 automatically scans the surface position on the photomask 10 corresponding to the position set on the image while the injector 124 blows a gas onto the surface of the photomask 10 to enhance the etching selectivity between the metal film and the quartz glass substrate (to increase the etching rate of the metal film while decreasing the etching rate of the quartz glass substrate), thus etching and removing the opaque defect in the set irradiation region (step S36).

Through these steps, the set irradiation region is enlarged to the above-described beam irradiation region and a desired photomask 10 is thus produced.

The above-described repair method with ion beam etching can be applied to the repair of opaque defects on a phase shift photomask described in the second preferred embodiment.

Fourth Preferred Embodiment

The first to third preferred embodiments show a method for compensating for the variation in transmittance in the repaired defect portion to suppress the dimensional variation rate of the resist pattern formed by transferring a metal film pattern onto a semiconductor wafer to zero % or within a range required for the device quality, where an opaque extension defect (including a bridge defect) connected to the metal film pattern on the photomask or an isolated opaque defect proximate to an edge of the pattern is repaired by using a laser light beam or an ion beam (they are generically referred to as a given beam) with an irradiation region obtained by correcting the conventional irradiation region by an optimized quantity or a quantity in permissible range of the bias offset of repairing $\Delta w_0$ or $\Delta w$. In the examples, the width in the second direction D2 of the pattern repaired region in the beam irradiation region is set approximately equal to the second width (=w2) in the second direction D2 of the opaque defect connected or proximate to one edge of the metal film pattern.

However, when the width in the second direction of the pattern repaired region is set equal to the second width of the opaque defect, and if the sign of the quantity of bias offset of repairing $\Delta w$ is minus and its absolute value is too large, then the missing portion 16 along the pattern edge (FIG. 3) may be detected as a clear defect in the step of defect inspection performed after the repair in the photomask producing process.

In order to avoid this problem in advance, the width in the second direction D2 of the recessed portion 16, 55 (FIG. 3, FIG. 20) in the original pattern should be set larger than the second width w2 of the opaque defect 13, 52 continuous with or proximate to the metal film pattern. Then the quartz glass portion underlying the recessed portion 16, 55 along the pattern edge adjacent to the repaired defect portion is enlarged in the second direction D2, which allows the absolute value of the quantity of bias offset of repairing $\Delta w$, which corresponds to the width in the first direction D1 of the pattern repaired region, to be set smaller than those shown in the first to third preferred embodiments.

Figure 26:
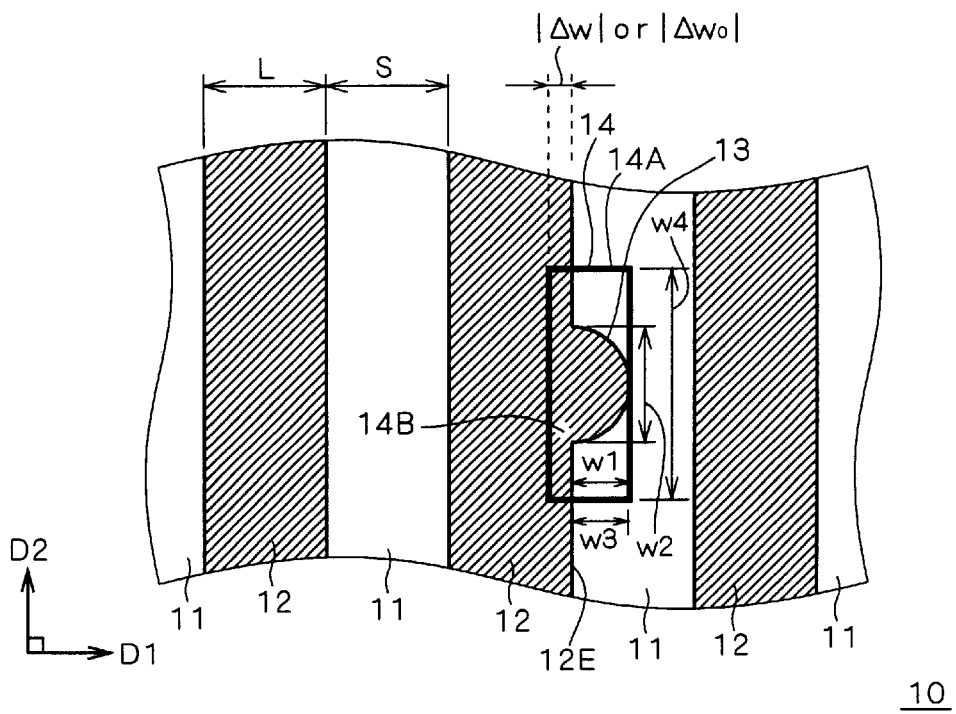
FIG. 26 is a plane view of a photomask showing a beam irradiation region in a fourth preferred embodiment.
Figure 27:
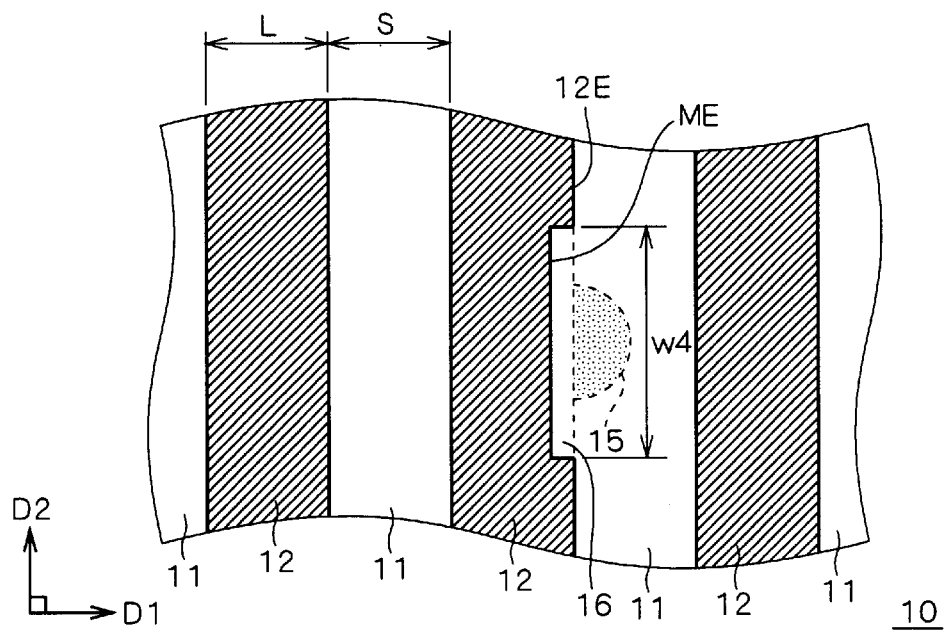
FIG. 27 is a plane view showing the photomask obtained after the opaque extension defect has been removed by irradiating the beam irradiation region of FIG. 26 with a laser light.

FIGS. 26 and 27 show an example of such setting.
(Additional Remarks)

(1) Such perfect or imperfect linear metal film interconnection patterns as shown in the first preferred embodiment and the like and such a metal film pattern having a hole pattern as shown in the second preferred embodiment are generically referred to as "pattern." Common CrON photomasks and phase shift photomasks are generically referred to as "photomask." This opaque defect repair method is basically applicable also to other various kinds of photomasks and various pattern configurations.

(2) In addition, while the first to fourth preferred embodiments have mainly described applications using positive resist, it is clear that this opaque defect repair method is applicable also to applications using negative resist.

(3) As already stated, a laser light beam or an ion beam is generically referred to as "given beam."

While the invention has been described in detail, the foregoing description is in all aspects illustrative and not restrictive. It is understood that numerous other modifications and variations can be devised without departing from the scope of the invention.

What is claimed is:

1. A method for manufacturing a photomask comprising a quartz glass and a pattern composed of a metal film formed on a surface of said quartz glass, the method comprising the steps of:

detecting whether said pattern has an opaque defect continuous with or proximate to said pattern and having a first width in a first direction and a second width in a second direction, said second direction being perpendicular to said first direction and corresponding to a direction in which an edge of said pattern is extended; and when said opaque defect is detected in said step of detecting, removing said opaque defect by applying a given beam onto a beam irradiation region obtained by correcting in said first direction an irradiation region on said surface of said quartz glass which contains said opaque defect and has third and fourth widths respectively in said first and second directions on the basis of a quantity of bias offset of repairing, wherein said quantity of bias offset of repairing is set in accordance with an output condition of said given beam, the dimension in said first direction of a region on said surface of said quartz glass where said opaque defect exists, and size of said opaque defect so that, when said pattern is transferred onto a semiconductor substrate to form a resist pattern by using said photomask obtained after said step of applying the given beam, the rate of dimensional variation of said resist pattern with respect to original dimension of said resist pattern to be obtained in the absence of said opaque defect falls within a given range, and when said quantity of bias offset of repairing has a minus sign, said given beam is controlled so that said beam irradiation region is given as a region including said irradiation region and a pattern repaired region extending into said pattern in said first direction by the absolute value of said quantity of bias offset of repairing, from a boundary between said opaque defect and said pattern when said opaque defect is continuous with said pattern, and from a part facing to said opaque defect in said edge of said pattern when said opaque defect is proximate to said pattern.

2. The photomask manufacturing method according to claim 1, wherein said pattern repaired region has, in said second direction, a width larger than said second width.

3. The photomask manufacturing method according to claim 1, wherein said quantity of bias offset of repairing corresponds to an optimum quantity of the bias offset, and said optimum quantity of the bias offset is a quantity of the bias offset which is set when said rate of dimensional variation is 0%.

4. The photomask manufacturing method according to claim 1, wherein when said quantity of bias offset of repairing has a plus sign, said given beam is controlled so that said beam irradiation region is given as a region obtained by narrowing said irradiation region in said first direction by the absolute value of said quantity of the bias offset.

5. A semiconductor device comprising:

a semiconductor substrate; and an integrated circuit pattern obtained on the basis of a resist pattern obtained by transferring said pattern onto said semiconductor substrate by using a photomask manufactured by said photomask manufacturing method of claim 4.

6. The photomask manufacturing method according to claim 1, wherein said pattern is a linear interconnection pattern.

7. The photomask manufacturing method according to claim 1, wherein said pattern has a rectangular opening, and
said edge of said pattern corresponds to a part of the side of said opening.

8. The photomask manufacturing method according to claim 1, wherein said given beam is a laser light beam.

9. The photomask manufacturing method according to claim 1, wherein said given beam is an ion beam.

10. A semiconductor device comprising:

a semiconductor substrate; and an integrated circuit pattern obtained on the basis of a resist pattern obtained by transferring said pattern onto said semiconductor substrate by using a photomask manufactured by said photomask manufacturing method of claim 1.

11. A method for manufacturing a photomask comprising a quartz glass and adjacent first and second patterns composed of a metal film formed on a surface of said quartz glass, the method comprising the steps of:

detecting whether said patterns have an opaque defect continuous with said first and second patterns and having a first width in a first direction and a second width in a second direction, said second direction being perpendicular to said first direction and corresponding to a direction in which edges of said patterns are extended; and when said opaque defect is detected in said step of detecting, removing said opaque defect by applying a given beam onto a beam irradiation region obtained by correcting in said first direction an irradiation region on said surface of said quartz glass which contains said opaque defect and has a third width corresponding to said first width and a fourth width respectively in said first and second directions on the basis of a quantity of bias offset of repairing, wherein said quantity of bias offset of repairing is set in accordance with an output condition of said given beam, the dimension in said first direction of a region on said surface of said quartz glass where said opaque defect exists, and size of said opaque defect so that, when said patterns are transferred onto a semiconductor substrate to form resist patterns by using said photomask obtained after said step of applying the given beam, the rate of dimensional variation of said resist patterns with respect to original dimension of said resist patterns to be obtained in the absence of said opaque defect falls within a given range, said quantity of bias offset of repairing has an absolute value equal to a sum of the absolute value of a first quantity of the bias offset and the absolute value of a second quantity of the bias offset, and said beam irradiation region comprises said irradiation region, a first pattern repaired region extending into said first pattern in said first direction by said absolute value of said first quantity of bias offset of repairing from a boundary between said first pattern and said opaque defect, and a second pattern repaired region extending into said second pattern in said first direction by said absolute value of said second quantity of the bias offset from a boundary between said second pattern and said opaque defect.

12. The photomask manufacturing method according to claim 11, wherein said first and second pattern repaired regions each have, in said second direction, a width larger than said second width.

13. A semiconductor device comprising:

a semiconductor substrate; and an integrated circuit pattern obtained on the basis of a resist pattern obtained by transferring said patterns onto said semiconductor substrate by using a photomask manufactured by said photomask manufacturing method of claim 11.

14. A photomask comprising:

a quartz glass having a repaired defect region; and a pattern composed of a metal film formed on a surface of said quartz glass, wherein part of one edge of said pattern is removed in a vicinity of said repaired defect region to compensate for said repaired defect region.

15. The photomask according to claim 14, further comprising:

another pattern formed on said surface of said quartz glass, composed of a metal film, and adjacent to said pattern, wherein part of an edge of said another pattern which faces to said one edge of said pattern is also removed in a vicinity of said repaired defect region to compensate for said repaired defect region.

16. A semiconductor device comprising:

a semiconductor substrate; and an integrated circuit pattern obtained on the basis of a resist pattern obtained by transferring said pattern onto said semiconductor substrate by using said photomask of claim 14.

* * * * *